US008071271B2

(12) United States Patent
Ichiki et al.

(10) Patent No.: US 8,071,271 B2
(45) Date of Patent: Dec. 6, 2011

(54) CONDUCTIVE FILM AND METHOD FOR PRODUCING THE SAME

(75) Inventors: Akira Ichiki, Minami-ashigara (JP); Makoto Kusuoka, Minami-ashigara (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 12/594,120

(22) PCT Filed: Mar. 28, 2008

(86) PCT No.: PCT/JP2008/056150
§ 371 (c)(1),
(2), (4) Date: Mar. 17, 2010

(87) PCT Pub. No.: WO2008/123437
PCT Pub. Date: Oct. 16, 2008

(65) Prior Publication Data
US 2010/0190111 A1    Jul. 29, 2010

(30) Foreign Application Priority Data
Mar. 30, 2007 (JP) .................................. 2007-093209

(51) Int. Cl.
*G03F 7/00* (2006.01)
*G03F 1/00* (2006.01)
*H01L 21/00* (2006.01)
*H05K 1/00* (2006.01)
*H05K 1/09* (2006.01)

(52) U.S. Cl. ...................... 430/270.1; 430/311; 430/315; 430/319; 430/320; 174/250; 174/256; 174/257; 174/258

(58) Field of Classification Search .................. 430/311, 430/315, 319, 320, 270.1; 174/250, 256–258
See application file for complete search history.

(56) References Cited

U.S. PATENT DOCUMENTS

| | | | |
|---|---|---|---|
| 6,054,647 A | 4/2000 | Ridener | |
| 7,749,686 B2 * | 7/2010 | Ichiki et al. | 430/311 |
| 2006/0115636 A1 | 6/2006 | Yoshida et al. | |
| 2007/0015094 A1 | 1/2007 | Habu | |
| 2009/0017277 A1 | 1/2009 | Nakahira | |
| 2009/0029125 A1 | 1/2009 | Nakahira | |
| 2009/0133922 A1 | 5/2009 | Okazaki | |

FOREIGN PATENT DOCUMENTS

| | | |
|---|---|---|
| CN | 1668783 | 9/2005 |
| EP | 2068328 | 6/2009 |
| JP | 10-041682 | 2/1998 |
| JP | 11-016491 | 1/1999 |
| JP | 2000-013088 | 1/2000 |
| JP | 2004-221564 | 8/2004 |
| JP | 2004-221565 | 8/2004 |
| JP | 2006-024485 | 1/2006 |
| JP | 2006-290948 | 10/2006 |
| JP | 2006-332459 | 12/2006 |
| JP | 2006-336057 | 12/2006 |
| JP | 2007-129205 | 5/2007 |
| JP | 2007-235115 | 9/2007 |
| WO | 2006/088059 | 8/2006 |
| WO | WO2006/088026 | 8/2006 |
| WO | 2007/037545 | 4/2007 |
| WO | 2007/088896 | 9/2007 |
| WO | 2008-038764 A1 | 4/2008 |
| WO | 2008/075771 | 6/2008 |

OTHER PUBLICATIONS

CN Office Action dated Apr. 19, 2011; Application No. 200880010732.1.

* cited by examiner

*Primary Examiner* — Geraldina Visconti
(74) *Attorney, Agent, or Firm* — Young & Thompson

(57) ABSTRACT

Disclosed is a method for producing a conductive film, which includes a silver metal forming step for forming a silver metal portion by exposing and developing a photosensitive material which has a silver salt-containing layer containing a silver salt on a supporting body, and a smoothing step for smoothing the silver metal portion. The smoothing step is performed by calender roll at a line pressure of not less than 1960 N/cm (200 kgf/cm). Consequently, the surface resistance of the film after development can be reduced in production of a conductive film which is effective for shielding electromagnetic waves.

23 Claims, 2 Drawing Sheets

CONDUCTIVE FILM AND METHOD FOR PRODUCING THE SAME

TECHNICAL FIELD

The present invention relates to a conductive film and a method for producing the same, particularly to a conductive film useful for shielding electromagnetic waves in front surfaces of display devices such as CRTs (cathode ray tubes), PDPs (plasma display panels), liquid crystal displays, EL (electroluminescence) displays, and FEDs (field emission displays), microwave ovens, electronic devices, printed circuit boards, etc., and a method for producing the same.

BACKGROUND ART

Problems of electro-magnetic interference (EMI) have been rapidly increasing in recent years along with increase in use of various electric and applied-electronic equipments. It has been indicated that the EMI causes malfunction or failure of the electronic or electric equipment, and further causes health disorder of an operator of the equipment. Therefore, the electronic and electric equipments are required to limit the intensity of an electromagnetic wave therefrom to a standard or a regulation.

The electromagnetic wave has to be shielded to solve the EMI problems, and a metal, which has a non-transmissivity to the electromagnetic wave, can be utilized for the shielding. For example, the electromagnetic wave can be shielded by a method of using a housing of a metal or a highly conductive material, a method of inserting a metal plate between circuit boards, a method of covering a cable with a metal foil, etc. However, display devices such as CRTs and PDPs need to have a transparent surface such that the operator can recognize characters, etc. shown in the screen.

Patent Document 1: Japanese Laid-Open Patent Publication No. 2000-013088
Patent Document 2: Japanese Laid-Open Patent Publication No. 2006-024485
Patent Document 3: Japanese Laid-Open Patent Publication No. 10-041682
Patent Document 4: Japanese Laid-Open Patent Publication No. 2004-221564
Patent Document 5: Japanese Laid-Open Patent Publication No. 2004-221565
Patent Document 6: Japanese Laid-Open Patent Publication No. 2006-332459

DISCLOSURE OF THE INVENTION

Various conductive and light transmittable materials using metal meshes with openings have been proposed.
(1) Silver Paste-printed Mesh For example, a method containing printing a silver powder paste to form a silver mesh has been disclosed (see Patent Documents 1 and 2). In this method, the obtained silver mesh is disadvantageous in large line width and low transmittance because of the printing process. In Patent Document 2, silver particles are pressure-fused to improve the conductivity. However, the resultant mesh has insufficient film strength when fused under a low pressure load, and on the other hand the image is enlarged when fused under a high pressure load. Thus, it is difficult to obtain the mesh excellent in both of the light transmittability and film strength. Furthermore, since the silver particles are used, the resultant mesh has silver color, thereby resulting in contrast reduction in an image of a display device.

(2) Etched Copper Mesh Produced by Photolithography

A method containing etching a copper foil by photolithography to form a copper mesh on a transparent base has been proposed (see, for example, Patent Document 3). In this method, the mesh can be microfabricated, and thereby can have high opening ratio (high transmittance) and can shield a high-intensity electromagnetic wave. However, this method for producing the mesh requires many steps disadvantageously.

(3) Conductive Silver Formation Method Using Silver Salt

A method for producing a light-transmitting electromagnetic wave-shielding film, containing exposing and developing a photosensitive film having a silver salt-containing layer to form a metallic silver portion, and a photosensitive material needed in the production have been disclosed (see, for example, Patent Documents 4 and 5). However, recently there has been a demand for further lowering the surface resistance of the developed film. The conductivity of the developed silver can be improved by reducing a binder such as gelatin, thereby increasing the silver halide particle density in the photosensitive silver salt material. However, there are limitations to this improvement. For example, the silver halide particles may be aggregated to cause a defect on the surface, and a black pepper (black spot) defect may be generated in the development. Thus, a technology capable of further improving the conductivity of the developed silver has been anticipated. Additionally, a method containing increasing the swelling ratio of the silver salt-containing layer, thereby improving the conductivity of the developed silver, has been proposed (see Patent Document 6). However, when the Ag/gelatin ratio is increased, the resultant film is brittle, and a defect is often caused.

In view of the above problems, an object of the present invention is to provide a method for producing a conductive film, which is capable of efficiently producing a transparent conductive film that has low surface resistance after development, exhibits less defects on the surface, is sufficient in film strength, and exhibits suitable image blackness in a display device.

Another object of the present invention is to provide a conductive film that has low surface resistance and is suitable for an electromagnetic wave-shielding film or a printed circuit board.

As a result of intense research in view of solving the above problems, the inventors have found that the conductivity of a conductive film can be remarkably improved by subjecting a developed metallic silver portion to a smoothing treatment. The present invention has been accomplished based on the finding.

[1] A method for producing a conductive film according to a first aspect of the present invention, comprising: a metallic silver forming step of exposing and developing a photosensitive material comprising a support and thereon a silver salt-containing layer containing a silver salt to form a metallic silver portion; and a smoothing treatment step of subjecting the metallic silver portion to a smoothing treatment.

In the method, the surface resistance of the developed photosensitive material can be lowered, and the obtained conductive film can be suitably used in an electromagnetic wave-shielding film or a printed circuit board.

[2] A method according to the first aspect, wherein the smoothing treatment is carried out using a calender roll. The calender roll may have a pair of metal rolls or a combination of a metal roll and a resin roll.

The smoothing treatment may be repeated several times to apply pressure uniformly in the width direction. It is preferred that the calender roll has a multistage structure containing 2 to 7 rolls (1 to 6 nips). An adhesive rubber roller may be used as a cleaner roll in combination with the calender roll to remove dirt from the calender roll and to prevent imprints.

[3] A method according to the first aspect, wherein the smoothing treatment is carried out at a line pressure of 1960 N/cm (200 kgf/cm) or more. In the present invention, the conductive film is produced by the method using the photosensitive material containing the silver salt (particularly a silver halide), and the smoothing treatment may be carried out at the high line pressure of 1960 N/cm (200 kgf/cm) or more, whereby the surface resistance of the conductive film can be sufficiently lowered. When the metallic silver portion has a thin wiring structure, the line width of the metallic silver portion may be increased in the smoothing treatment at such a high line pressure, thereby failing to form a desired pattern. However, in the case of subjecting the developed silver derived from the silver salt (particularly the silver halide) to the smoothing treatment, the metallic silver portion can be formed in the desired pattern with less increase of the line width. Thus, in the invention, the metallic silver portion can be uniformly formed in the desired pattern, so that the productivity of the conductive film can be further improved.

[4] A method according to the first aspect, wherein the smoothing treatment is carried out at a line pressure of 6860 N/cm (700 kgf/cm) or less.

[5] A method according to the first aspect, wherein the development comprises a fixation treatment, and a layer containing the metallic silver portion is dried before the fixation treatment.

[6] A method according to the first aspect, wherein the development comprises a fixation treatment, and the development, a treatment of drying the layer containing the metallic silver portion, the smoothing treatment, and the fixation treatment are carried out in this order.

[7] A method according to the first aspect, wherein the silver salt-containing layer is substantially free from binder hardening agents or has a swelling ratio of 150% or more.

[8] A method according to the first aspect, wherein the photosensitive material is dipped in (or brought into contact with) a hot water or a water vapor having a temperature of 60° C. or higher after the metallic silver forming step. When this step is carried out particularly after the smoothing treatment, the conductivity can be improved more preferably.

[9] A method according to the first aspect, wherein an overcoat layer comprising a water-soluble polymer is disposed on the silver salt-containing layer, and the photosensitive material is dipped in (or brought into contact with) a hot water or a water vapor having a temperature of 60° C. or higher after the metallic silver forming step. When this step is carried out particularly after the smoothing treatment, the conductivity can be improved more preferably.

[10] A method according to the first aspect, wherein the development comprises a fixation treatment, and the photosensitive material is treated with a fixer that is free from thiosulfate salts or contains 0.1 mol/L or less of a thiosulfate salt.

[11] A method according to the first aspect, wherein the silver salt-containing layer or a developer contains a polyethylene oxide derivative represented by the following general formula.

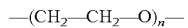 (General formula)

[12] A method according to the first aspect, wherein the development is carried out at 25° C. or lower.

[13] A method according to the first aspect, wherein a photographically useful compound capable of adsorbing to a particle to stabilize the particle morphology is added before water washing and demineralization in preparation of the silver salt.

[14] A method according to the first aspect, further comprising a plating step of forming a plated layer on a surface of the metallic silver portion before or after the smoothing treatment step.

[15] A method according to the first aspect, wherein the metallic silver portion and a light-transmitting portion are formed in the metallic silver forming step.

[16] A method according to the first aspect, wherein the metallic silver portion and an insulating portion are formed in the metallic silver forming step.

[17] A method according to the first aspect, wherein after the smoothing treatment, the metallic silver portion comprises silver and a non-conductive polymer and has an Ag/non-conductive polymer volume ratio of 1/1 or more.

[18] A method according to the first aspect, wherein after the smoothing treatment, the metallic silver portion comprises silver and a non-conductive polymer and has an Ag/non-conductive polymer volume ratio of 2/1 or more.

[19] A method according to the first aspect, wherein the non-conductive polymer comprises a gelatin at a volume ratio of 50% or more.

[20] A method, according to the first aspect, wherein the non-conductive polymer comprises a natural macromolecular polysaccharide derived from a macromolecular red alga.

[21] A method according to the first aspect, wherein the natural macromolecular polysaccharide derived from the red alga is selected from kappa carrageenans, iota carrageenans, lambda carrageenans, and furcellarans.

[22] A method according to the first aspect, further comprising a step of dipping the photosensitive material in an aqueous solution of a reducing agent before the smoothing treatment step.

[23] A method according to the first aspect, further comprising a blackening treatment step of subjecting a surface of the metallic silver portion to a blackening treatment using a blackening liquid after the smoothing treatment step. When a developed silver having a high Ag/binder volume ratio is subjected to the smoothing treatment, the developed silver has a high surface reflectance and looks whitish, thereby adversely affecting image contrast of a display device in some cases. The present invention can solve this problem.

[24] A method according to the above, wherein the blackening liquid contains nickel, zinc, or tin.

[25] A method according to the first aspect, wherein the silver salt-containing layer has an Ag/binder volume ratio of 1/2 or more. By increasing the Ag content of the silver salt-containing layer, the surface resistance of the conductive film can be further lowered, and the effect of the smoothing treatment can be further enhanced.

[26] A method according to the first aspect, wherein the silver salt-containing layer has an Ag/binder volume ratio of 1/1 or more.

[27] A method according to the first aspect, wherein the silver salt-containing layer has an Ag/binder, volume ratio of 2/1 or more.

[28] A method according to the first aspect, wherein the silver salt-containing layer comprises at least two emulsion layers, the emulsion layer closest to the support has an Ag/binder volume ratio of 1.5/1 or less, and the upper emulsion layer has an Ag/binder volume ratio of 1.5/1 or more.

When a developed silver having a high Ag/binder volume ratio is subjected to the smoothing treatment, the developed silver has a high surface reflectance and looks whitish. When the transparent conductive film is attached to a display, the film is required to have a blackish backside through the support in some cases. A sufficiently blackish color can be obtained by undercoating of an emulsion layer having a low Ag/binder volume ratio.

[29] A method according to the first aspect, wherein the silver salt-containing layer is provided on both sides of the support.

[30] A method according to the first aspect, wherein the support has a thickness of 8 to 200 μm.

[31] A method according to the first aspect, wherein the support comprises a resin film.

[32] A method according to the first aspect, wherein the photosensitive material further comprises a non-photosensitive intermediate layer containing a gelatin or an SBR between the support and the silver salt-containing layer.

In the present invention, the non-photosensitive intermediate layer is formed between the support and the silver salt emulsion layer to effectively improve the adhesion of the developed silver particles to the support. In a case where the silver salt-containing layer is substantially free from binder hardening agents or has a high swelling ratio, the film strength can be increased by the smoothing treatment. It has been found that the adhesion between the support and the silver image can be dramatically improved by the non-photosensitive intermediate layer.

[33] A method according to the above, wherein the resin film comprises a polyethylene terephthalate film or a polyimide film.

[34] A method according to the first aspect, wherein the product of the conductive film has an electromagnetic wave-shielding property.

[35] A method according to the first aspect, wherein the metallic silver portion has a wiring pattern with a line width of 0.1 to 25 μm.

[36] A method according to the first aspect, wherein the conductive film is a printed circuit board.

[37] A method for producing a conductive film according to a second aspect of the present invention, comprising exposing and developing a silver salt-containing layer containing a silver salt disposed on a support to form a metallic silver portion, wherein a chemically modified gelatin is used at least partly in a dispersion medium in preparation of the silver salt, and an emulsion of the chemically modified gelatin can be water-washed and demineralized by a precipitation method without an anionic precipitating agent.

[38] A method according to the second aspect, wherein the chemically modified gelatin is a phthalated gelatin.

[39] A conductive film according to a third aspect of the present invention, obtained by a method according to the first or second aspect.

[40] A conductive film according to a fourth aspect of the present invention, comprising a support and thereon a metallic silver portion containing silver at a density of 7.0 to 10.5 g/cm$^3$, wherein a non-photosensitive intermediate layer containing a gelatin or an SBR is disposed between the support and the metallic silver portion.

When the conductive film has a high metal density, the adhesion to the support is deteriorated. It has been found that the adhesion can be dramatically improved by the non-photosensitive intermediate layer, whereby the conductive film can be excellent in both the conductivity and adhesion.

[41] A conductive film according to the fourth aspect, which is an electromagnetic wave-shielding film or a printed circuit board.

As described above, a conductive film having a sufficiently lowered surface resistance can be produced by the method according to the present invention. The conductive film of the present invention is high in the conductivity, electromagnetic wave-shielding property, and light transmittability.

By forming the metallic silver portion in a thin wiring pattern in the conductive film, a light-transmitting electromagnetic wave-shielding film having a mesh of the metallic silver portion and the light-transmitting portion can be obtained.

According to the present invention, there can be provided a method for producing a light-transmitting electromagnetic wave-shielding, which is capable of forming a thin wiring pattern by fewer steps, thereby inexpensively mass-producing a light-transmitting electromagnetic wave-shielding film having a high electromagnetic wave-shielding property, a high transparency, and a black mesh portion.

According to the present invention, there can be provided a printed board with a high conductivity and less pinholes.

According to the present invention, there can be provided a method for producing a printed circuit board, which is capable of forming a thin wiring pattern and inexpensively mass-producing a printed circuit board with less impact on the environment.

BEST MODE FOR CARRYING OUT THE INVENTION

Figure 1:
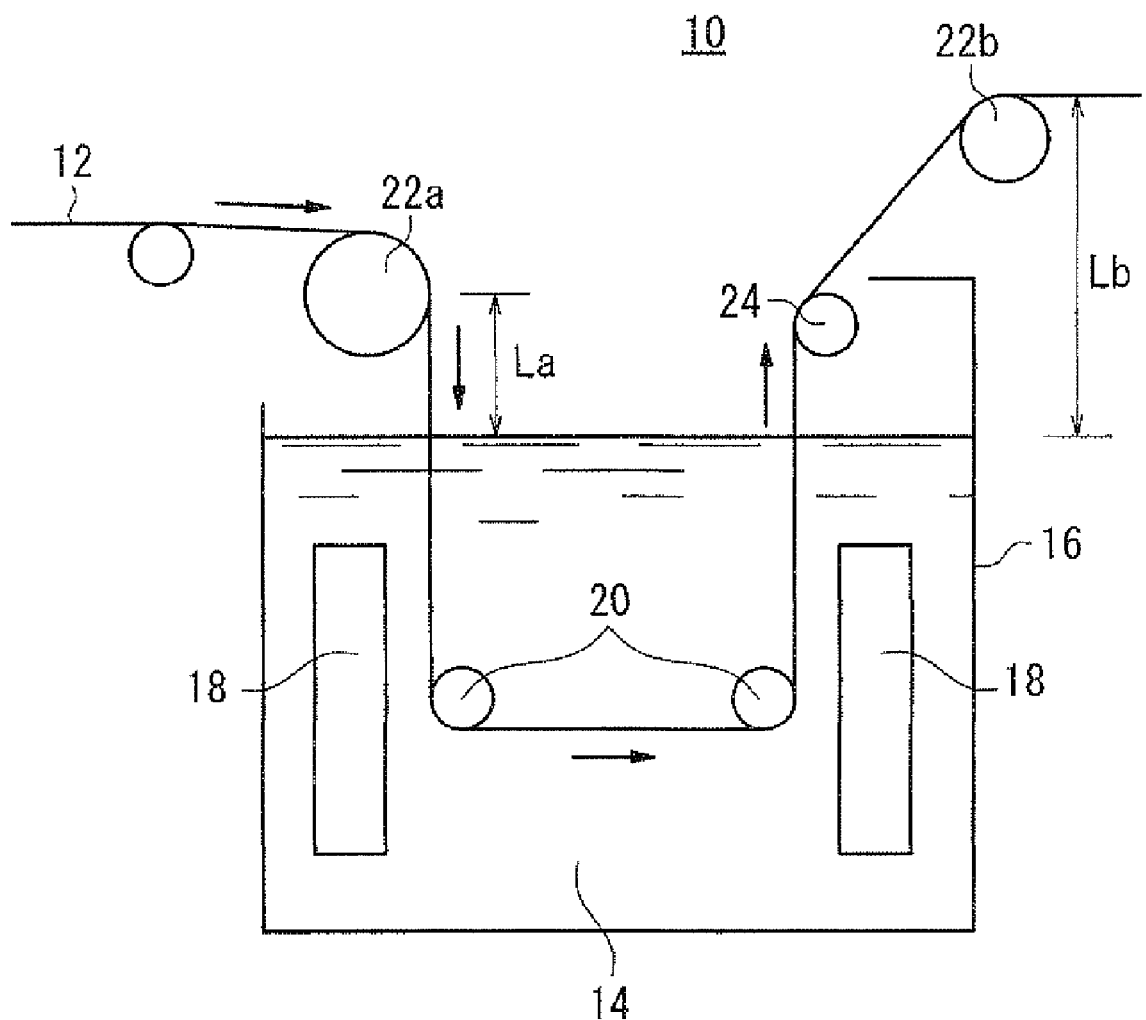
FIG. 1 is a schematic view showing an example of an electrolytic plating bath suitable for the plating treatment according to the present invention.

The conductive film production method of the present invention will be described below. The conductive film of the present invention can be used also as a light-transmitting electromagnetic-shielding film or a printed board.

It should be noted that, in this description, a numeric range of "A to B" includes both the numeric values A and B as the lower and upper limit values, respectively.

<Photosensitive Material for Conductive Film Production>
[Support]

The support for the photosensitive material used in the production method of the present invention may be a plastic film, a plastic plate, a glass plate, etc.

Examples of materials of the plastic film and the plastic plate include polyesters such as polyethylene terephthalates (PET) and polyethylene naphthalates; polyolefins such as polyethylenes (PE), polypropylenes (PP), polystyrenes, and EVA; vinyl resins such as polyvinyl chlorides and polyvinylidene chlorides; polyether ether ketones (PEEK); polysulfones (PSF); polyether sulfones (PES); polycarbonates (PC); polyamides; polyimides; acrylic resins; and triacetyl celluloses (TAC).

In the present invention, the plastic film and the plastic plate may have a monolayer structure or a multilayer film containing two or more layers.

The support may be a metal foil of aluminum, etc.

[Silver Salt-containing Layer]

The photosensitive material used in the production method of the present invention has the support and thereon an emulsion layer containing a silver salt as a light sensor (the silver salt-containing layer). The silver salt-containing layer may contain a binder, a solvent, etc. in addition to the silver salt. Unless some question arises, the emulsion layer containing the silver salt (or the silver salt-containing layer) may be simply referred to as the emulsion layer.

The emulsion layer is characterized by exhibiting swelling of 250% or more. In the present invention, the swelling ratio is defined by the following equation.

Swelling ratio (%)=100×((b)−(a))/(a)

In the above equation, (a) represents the thickness of the emulsion layer in the dry state, and (b) represents the thickness of the emulsion layer after dipping the layer in distilled water at 25° C. for 1 minute.

For example, the dry emulsion layer thickness of (a) may be measured by observing a cross section of a sample using a scanning electron microscope. The swelled emulsion layer thickness of (b) may be measured by freeze-drying a swelled sample using liquid nitrogen, and then observing a cross section of the sample using a scanning electron microscope.

In the present invention, it is preferred that the emulsion layer of the photosensitive material exhibits the swelling of 250% or more. However, the preferred swelling ratio range varies depending on the Ag/binder ratio of the emulsion layer. In the film, the silver halide cannot be swelled, while a binder portion can be swelled. The binder portion exhibits a constant swelling ratio regardless of the Ag/binder ratio. However, as the Ag/binder ratio is increased, the swelling ratio of the entire emulsion layer is lowered. In the present invention, in a case where the Ag/binder ratio of the emulsion layer is 4 or less, the swelling ratio of the emulsion layer is preferably 250% or more. In a case where the Ag/binder ratio is 4.5 or more but less than 6, the swelling ratio is preferably 200% or more. In a case where the Ag/binder ratio is 6 or more, the swelling ratio is preferably 150% or more.

The emulsion layer may contain a dye, a binder, a solvent, etc. if necessary in addition to the silver salt. Each component in the emulsion layer will be described below.

<Dye>

The photosensitive material may contain a dye in at least the emulsion layer. The dye is contained in the emulsion layer as a filter dye or for a purpose of irradiation prevention, etc. The dye may be a solid dispersion dye. Preferred examples of the dyes useful in the present invention include dyes represented by the general formulae (FA), (FA1), (FA2), and (FA3) of Japanese Laid-Open Patent Publication No. 9-179243, specifically the compounds (F1) to (F34) of this patent publication. The preferred examples further include (II-2) to (II-24), (III-5) to (III-18), and (IV-2) to (IV-7) described in Japanese Laid-Open Patent Publication No. 7-152112.

The dye used in the present invention may be such as decolored in the solid fine particle dispersion state in the development or fixation treatment. Examples of such dyes include cyanine dyes, pyrylium dyes, and aminium dyes described in Japanese Laid-Open Patent Publication No. 3-138640. Examples of dyes not decolored in the treatment include cyanine dyes having a carboxyl group described in Japanese Laid-Open Patent Publication No. 9-96891; cyanine dyes having no acidic groups described in Japanese Laid-Open Patent Publication No. 8-245902; lake cyanine dyes described in Japanese Laid-Open Patent Publication No. 8-333519; cyanine dyes described in Japanese Laid-Open Patent Publication No. 1-266536; holopolar cyanine dyes described in Japanese Laid-Open Patent Publication No. 3-136038; pyrylium dyes described in Japanese Laid-Open Patent Publication No. 62-299959; polymer cyanine dyes described in Japanese Laid-Open Patent Publication No. 7-253639; solid fine particle dispersions of oxonol dyes described in Japanese Laid-Open Patent Publication No. 2-282244; light scattering particles described in Japanese Laid-Open Patent Publication No. 63-131135; $Yb^{3+}$ compounds described in Japanese Laid-Open Patent Publication No. 9-5913; and ITO powders described in Japanese Laid-Open Patent Publication No. 7-113072. Further, dyes represented by the general formulae (F1) and (F2) of Japanese Laid-Open Patent Publication No. 9-179243, specifically the compounds F35 to F112, may be used in the present invention.

The above dye may be a water-soluble dye, and examples thereof include oxonol dyes, benzylidene dyes, merocyanine dyes, cyanine dyes, and azo dyes. Among them, oxonol dyes, hemioxonol dyes, and benzylidene dyes are effective in the present invention. Specific examples of the water-soluble dyes useful in the present invention include dyes described in UK Patent Nos. 584,609 and 1,177,429; Japanese Laid-Open Patent Publication Nos. 48-85130, 49-99620, 49-114420, 52-20822, 59-154439, and 59-208548; and U.S. Pat. Nos. 2,274,782, 2,533,472, 2,956,879, 3,148,187, 3,177,078, 3,247,127, 3,540,887, 3,575,704, 3,653,905, and 3,718,427.

The mass ratio of the dye to the total solid contents in the emulsion layer is preferably 0.01% to 10% by mass, more preferably 0.1% to 5% by mass, in view of the effects such as the irradiation prevention effect and the sensitivity reduction due to the excess addition.

<Silver Salt>

The silver salt used in the present invention may be an inorganic silver salt such as a silver halide or an organic silver salt such as silver acetate. In the present invention, the silver halide excellent in light sensing property is preferably used as the silver salt.

The silver halide, preferably used in the present invention, will be described below.

In the present invention, the silver halide excellent in light sensing property is preferably used as the silver salt. Technologies for photographic silver salt films, photographic papers, print engraving films, emulsion masks for photomasking, and the like, using the silver halide, may be utilized in the present invention.

The silver halide may contain a halogen element of chlorine, bromine, iodine, or fluorine, and may contain a combination of the elements. For example, the silver halide preferably contains AgCl, AgBr, or AgI, more preferably contains AgBr or AgCl, as a main component. Also silver chlorobromide, silver iodochlorobromide, and silver iodobromide can be preferably used as the silver halide. The silver halide is further preferably silver chlorobromide, silver bromide, silver iodochlorobromide, or silver iodobromide, most preferably silver chlorobromide or silver iodochlorobromide having a silver chloride content of 50 mol % or more.

The term "the silver halide contains AgBr (silver bromide) as a main component" means that the mole ratio of bromide ion is 50% or more in the silver halide composition. The silver halide particle containing AgBr as a main component may contain an iodide or chloride ion in addition to the bromide ion.

The silver iodide content of the silver halide emulsion is preferably 1.5 mol % per 1 mol of the silver halide emulsion. When the silver iodide content is 1.5 mol %, fogging can be reduced and pressure capability can be improved. The silver iodide content is more preferably 1 mol % or less per 1 mol of the silver halide emulsion.

The silver halide is in the state of solid particles. The average particle size of the silver halide particles is preferably 0.1 to 1000 nm (1 μm), more preferably 0.1 to 100 nm, further preferably 1 to 50 nm, in spherical equivalent diameter, in view of the image quality of the patterned metallic silver layer formed after the exposure and development.

The spherical equivalent diameter of the silver halide particle means a diameter of a spherical particle having the same volume as the silver halide particle.

The shape of the silver halide particle is not particularly limited, and may be a spherical shape, a cubic shape, a tabular shape (such as a tabular hexagonal shape, a tabular triangular shape, or a tabular quadrangular shape), an octahedron shape, a tetradecahedron shape, etc. The silver halide particle preferably has a cubic shape or a tetradecahedron shape.

The inside and the surface of the silver halide particle may comprise the same or different phases. Further, the silver halide particle may have a localized layer having a different halogen composition inside or on the surface.

The silver halide emulsion, used as a coating liquid for the emulsion layer in the present invention, may be prepared by a method described in P. Glafkides, "*Chimie et Physique Photographique*", Paul Montel, 1967, G. F. Dufin, "*Photographic Emulsion Chemistry*", The Forcal Press, 1966, V. L. Zelikman, et al., "*Making and Coating Photographic Emulsion*", The Forcal Press, 1964, etc.

Thus, the silver halide emulsion may be prepared by an acidic process or a neutral process. A soluble silver salt and a soluble halogen salt may be reacted by using a one-side mixing process, a simultaneous mixing process, or a combination thereof.

The silver particle may be formed in the presence of excess silver ions by a so-called reverse mixing process. The formation may be achieved by using a so-called controlled double jet method, one of the simultaneous mixing processes containing maintaining a constant pAg in a liquid phase for producing the silver halide.

It is also preferred that the silver particles are formed using a so-called silver halide solvent such as ammonia, a thioether, or a tetrasubstituted thiourea. The solvent is more preferably a tetrasubstituted thiourea compound as described in Japanese Laid-Open Patent Publication Nos. 53-82408 and 55-77737. Preferred thiourea compounds include tetramethylthiourea and 1,3-dimethyl-2-imidazolidinethione. The amount of the silver halide solvent is preferably $10^{-5}$ to $10^{-2}$ mol per 1 mol of the silver halide, though the amount may be changed depending on the types of compounds used, the desired particle size, and the desired halogen composition.

The controlled double jet method and the particle forming method using the silver halide solvent are preferred in the present invention because a silver halide emulsion having a regular crystal shape and a narrow particle size distribution can be easily prepared by using the methods.

It is preferred that the silver particles are rapidly grown within a range of the critical saturation degree to obtain a uniform particle size by using a method of changing the addition rate of silver nitrate or an alkali halide according to particle growth rate as described in UK Patent No. 1,535,016, and Japanese Patent Publication Nos. 48-36890 and 52-16364, or a method of changing the concentration of the aqueous solution as described in UK Patent No. 4,242,445 and Japanese Laid-Open Patent Publication No. 55-158124. The silver halide emulsion used for forming the emulsion layer in the present invention is preferably a monodisperse emulsion, and the variation coefficient thereof, obtained by {(Standard deviation of particle size)/(Average particle size)}×100, is preferably 20% or less, more preferably 15% or less, most preferably 10% or less.

The silver halide emulsion used in the present invention may be a mixture of a plurality of emulsions having different particle sizes.

The silver halide emulsion used in the present invention may contain a metal of Group VIII or VIIB. It is particularly preferred that the silver halide emulsion contains a rhodium compound, an iridium compound, a ruthenium compound, an iron compound, an osmium compound, or the like to achieve high contrast and low fogging. Those compounds may have various ligands, and examples of the ligands include cyanide ions, halogen ions, thiocyanate ions, nitrosyl ions, water, hydroxide ions, pseudohalogens, ammonia, and organic molecules such as amines (methylamine, ethylenediamine, etc.), heterocyclic compounds (imidazole, thiazole, 5-methylthiazole, mercaptoimidazole, etc.), ureas, and thioureas.

The silver halide emulsion may be effectively doped with a hexacyano-metal complex such as $K_4[Fe(CN)_6]$, $K_4[Ru(CN)_6]$, or $K_3[Cr(CN)_{0.6}]$ for increasing sensitivity.

The rhodium compound may be a water-soluble rhodium compound. Examples of the water-soluble rhodium compounds include halogenated rhodium (III) compounds, hexachloro-rhodium (III) complex salts, pentachloro-aquo-rhodium complex salts, tetrachloro-diaquo-rhodium complex salts, hexabromo-rhodium (III) complex salts, hexamine-rhodium (III) complex salts, trioxalato rhodium (III) complex salts, and $K_3Rh_2Br_9$.

The rhodium compound is used in the state of a solution of water or an appropriate solvent. The rhodium compound solution may be stabilized by a common method of adding an aqueous hydrogen halide solution (such as hydrochloric acid, hydrobromic acid, or hydrofluoric acid) or an alkali halide (such as KCl, NaCl, KBr, or NaBr). Instead of using the water-soluble rhodium compound, another silver halide particles, which are doped with rhodium beforehand, may be added to and dissolved in the mixture for preparing the silver halide.

Examples of the iridium compounds include hexachloro-iridium complex salts such as $K_2IrCl_6$ and $K_3IrCl_6$, hexabromo-iridium complex salts, hexamine-iridium complex salts, and pentachloro-nitrosyl-iridium complex salts.

Examples of the ruthenium compounds include hexachlororuthenium, pentachloronitrosylruthenium, and $K_4[Ru(CN)_6]$.

Examples of the iron compounds include potassium hexacyanoferrate (II) and ferrous thiocyanate.

The above mentioned ruthenium and osmium are added in the state of a water-soluble complex salt described in Japanese Laid-Open Patent Publication Nos. 63-2042, 1-285941, 2-20852, and 2-20855, etc. The water-soluble complex salt is particularly preferably a six-coordinate complex represented by the following formula:

$$[ML_6]^{n-}$$

wherein M represents Ru or Os, n represents 0, 1, 2, 3, or 4.

The counter ion is not important, and may be an ammonium or alkali metal ion. Preferred ligands include halide ligands, cyanide ligands, cyanoxide ligands, nitrosyl ligands, and thionitrosyl ligands. Specific examples of such complexes used in the present invention are illustrated below without intention of restricting the scope of the invention.

$[RuCl_6]^{3-}$, $[RuCl_4(H_2O)_2]^{1-}$, $[RuCl_5NO]^{2-}$, $[RuBr_5NS]^{2-}$, $[Ru(CO)_3Cl_3]^{2-}$, $[RuCOCl_5]^{2-}$, $[RuCOBr_5]^{2-}$, $[OsCl_6]^{3-}$, $[OsCl_5NO]^{2-}$, $[OsNO(CN)_5]^{2-}$, $[OsNSBr_5]^{2-}$, $[Os(CN)_6]^{4-}$, $[Os(O)_2(CN)_5]^{4-}$.

The amount of the compound added per 1 mol of the silver halide is preferably $10^{-10}$ to $10^{-2}$ mol/mol Ag, more preferably $10^{-9}$ to $10^{-3}$ mol/mol Ag.

Further, in the present invention, the silver halide may preferably contain Pd (II) ion and/or Pd metal. Pd is preferably contained in the vicinity of the surface of the silver halide particle though it may be uniformly distributed in the silver halide particle. The term "Pd is contained in the vicinity of the surface of the silver halide particle" means that the silver halide particle has a layer with a higher palladium content in a region of 50 nm or less in the depth direction from the surface, compared to the other layers of the particle.

Such silver halide particle can be prepared by adding Pd during the particle formation. Pd is preferably added after the silver ion and halogen ion are added by 50% or more of the total amounts respectively. Further, it is also preferred that Pd (II) ion is added in an after-ripening process to obtain the silver halide particle containing Pd near the surface.

The Pd-containing silver halide particle acts to accelerate the physical development or electroless plating, improve production efficiency of a desired electromagnetic wave-shielding material, and lower the production cost. Pd is well known and used as an electroless plating catalyst. In the present invention, Pd can be located in the vicinity of the surface of the silver halide particle, so that the remarkably expensive Pd can be saved.

In the present invention, the content of the Pd ion and/or Pd metal per 1 mol of silver in the silver halide is preferably $10^{-4}$ to 0.5 mol/mol Ag, more preferably 0.01 to 0.3 mol/mol Ag.

Examples of Pd compounds used include $PdCl_4$ and $Na_2PdCl_4$.

In the present invention, it is preferred that anionic precipitating agents are not used in the water washing and demineralization. It is preferred that a chemically modified gelatin is used in a dispersion medium, whereby the emulsion is precipitated without the anionic precipitating agents, only by PH control, and the supernatant is removed to carry out the water washing and demineralization. In a case where a positively charged amino group in a gelatin is converted to the uncharged or negatively charged state and the resultant gelatin is used as the dispersion medium, the emulsion can be precipitated only by lowering the PH, the anionic precipitating agents being not required. Examples of such gelatins include those modified by acetylation, deamination, benzoylation, dinitrophenylation, trinitrophenylation, carbamylation, phenylcarbamylation, succinylation, succination, phthalation, etc. In the present invention, the phthalated gelatin is more preferred.

Other examples of the water washing and demineralization methods without the anionic precipitating agents include methods containing the steps of adding an inorganic salt such as sodium sulfate or chrome alum to an emulsion, aggregating the emulsion, and removing the supernatant; methods containing ultrafiltration; methods containing the steps of precipitating an emulsion by centrifugation, and removing the supernatant; methods containing noodle water washing; and methods using a synthetic polymer as a dispersion medium. The methods can be carried out in accordance with references described in RESEARCH DISCLOSURE to be described later.

A so-called flocculation method is most commonly used for demineralization in the art. In the flocculation method, generally, an organic anionic compound is added as a precipitating agent to an emulsion, the pH of the emulsion is lowered to precipitate the emulsion, and the supernatant is removed to achieve the demineralization. The emulsion is precipitated because a positive charge (generally an amino group) in a gelatin is neutralized by bonding the anionic precipitating agent thereto, and a negative charge (generally a carboxyl group) in the gelatin is protonated and neutralized by lowering the pH of the emulsion, whereby the water solubility of the gelatin is reduced. The gelatin is precipitated together with the silver halide particle, and the emulsion is separated into a liquid and a solid. When the liquid is removed, also salts dissolved in the liquid are removed, whereby the demineralization of the emulsion can be achieved.

However, as a result of the inventors' research, it has been found that, in the case of using an emulsion with a high Ag/gelatin ratio, the anionic precipitating agent added in the demineralization by the most common flocculation method causes aggregation of the silver halide particles and coating surface defects. When the anionic precipitating agent is not used in the water washing, both of excellent conductivity and coating surface can be obtained.

The temperature in the water washing and demineralization is not particularly limited. The water washing is preferably carried out at a high temperature in view of accelerating the precipitation rate. In the present invention, the water washing and the demineralization are preferably carried out at 30° C. to 60° C.

The emulsion with a low gelatin content has a low protective colloid ability, and thereby often suffers from particle deformation in the demineralization. However, the particle deformation can be prevented by adding a photographically useful compound capable of adsorbing to the particle. In the present invention, it is more preferred that the photographically useful compound is adsorbed to prevent the particle deformation. The photographically useful compound for, stabilizing the particle shape is not particularly limited, and is preferably a spectral sensitizer, an antifoggant, a stabilizer, or the like. The compounds can be used in accordance with RESEARCH DISCLOSURE to be described later.

The pH may be selected in view of appropriate adsorption of the photographically useful compound for preventing the particle deformation. Also the pAg of the emulsion may be preferably controlled in view of appropriate adsorption of the photographically useful compound.

As with common photographic photosensitive silver halide materials, the silver halide emulsion according to the present invention may be subjected to chemical sensitization. In the chemical sensitization, a chemical sensitizer of a chalcogenite compound or a noble metal compound having a function of sensitizing the photosensitive material is added to the silver halide emulsion as cited in Japanese Laid-Open Patent Publication No. 2000-275770, paragraph 0078 or later. It is preferred that the silver salt for the photosensitive material of the present invention is an emulsion which is not chemically sensitized, and thus is a chemically unsensitized emulsion. In the preparation of the chemically unsensitized emulsion suitable for the present invention, the amount of the chemical sensitizer of the chalcogenite compound or the noble metal compound is preferably controlled within such a range that the sensitivity is increased only by 0.1 or less by the addition of the chemical sensitizer. In the preparation of the chemically unsensitized emulsion suitable for the present invention, the total amount of the chemical sensitizer of the chalcogenite compound or the noble metal compound is not specifically limited, and is preferably $5 \times 10^{-7}$ mol or less per 1 mol of the silver halide.

In the present invention, the sensitivity as the light sensor may be increased by chemical sensitization, which is generally used for photographic emulsions. Examples of the chemical sensitization methods include chalcogen sensitization methods (such as sulfur sensitization methods, selenium sensitization methods, and tellurium sensitization methods), noble metal sensitization methods (such as gold sensitization methods), and reduction sensitization methods. The methods may be used singly or in combination. Preferred combinations of the chemical sensitization methods include combinations of a sulfur sensitization method and a gold sensitization method, combinations of a sulfur sensitization method, a selenium sensitization method, and a gold sensitization method, and combinations of a sulfur sensitization method, a tellurium sensitization method, and a gold sensitization method.

The sulfur sensitization is generally carried out such that a sulfur sensitizer is added to the emulsion, and the emulsion is stirred at a high temperature of 40° C. or higher for a predetermined time. The sulfur sensitizer may be a known compound, and examples thereof include sulfur compounds contained in gelatin, and further various sulfur compounds such as thiosulfate salts, thiourea compounds, thiazole compounds, and rhodanine compounds. The sulfur compound is preferably a thiosulfate salt or a thiourea compound. The amount of the sulfur sensitizer added per 1 mol of the silver halide is preferably $10^{-7}$ to $10^{-2}$ mol, more preferably $10^{-5}$ to $10^{-3}$ mol, though the amount may be changed depending on various conditions such as pH, temperature, and silver halide particle size in a chemical ripening process.

A selenium sensitizer is used in the selenium sensitization, and it may be a known selenium compound. The selenium sensitization is generally carried out such that an unstable selenium compound and/or a non-unstable selenium compound are added to the emulsion, and the emulsion is stirred at a high temperature of 40° C. or higher for a predetermined time. Examples of the unstable selenium compounds include those described in Japanese Patent Publication Nos. 44-15748 and 43-13489, Japanese Laid-Open Patent Publication Nos. 4-109240 and 4-324855. In particular, a compound represented by the general formula (VIII) or (IX) of Japanese Laid-Open Patent Publication No. 4-324855 is preferably used as the unstable selenium compound.

A tellurium sensitizer is used in the tellurium sensitization for generating silver telluride on or inside the silver halide particle. The silver telluride is estimated to act as a sensitization nucleus. The rate of the silver telluride generation in the silver halide emulsion can be examined by a method described in Japanese Laid-Open Patent Publication No. 5-313284. Specific examples of the tellurium sensitizers include compounds described in U.S. Pat. Nos. 1,623,499, 3,320,069, and 3,772,031; UK Patent Nos. 235,211, 1,121, 496, 1,295,462, and 1,396,696; Canadian Patent No. 800, 958; Japanese Laid-Open Patent Publication Nos. 4-204640, 4-271341, 4-333043, and 5-303157; *J. Chem. Soc., Chem. Commun.*, 635 (1980); ibid, 1102 (1979); ibid, 645 (1979); *J. Chem. Soc., Perkin. Trans.* 1, 2191 (1980); S. Patai, "*The Chemistry of Organic Selenium and Tellurium Compounds*", Vol. 1 (1986); and ibid, Vol. 2 (1987). Particularly preferred are compounds represented by the general formulae (II), (III), and (IV) of Japanese Laid-Open Patent Publication No. 5-313284.

In the present invention, the amount of the selenium or tellurium sensitizer used per 1 mol of the silver halide is generally about $10^{-8}$ to $10^{-2}$ mol, preferably about $10^{-7}$ to $10^{-3}$ mol, though the amount may be changed depending on the silver halide particles used, the chemical ripening conditions, etc. The chemical sensitization in the present invention is carried out under conditions of a pH of 5 to 8, a pAg of 6 to 11, preferably 7 to 10, and a temperature of 40° C. to 95° C., preferably 45° C. to 85° C., though not particularly restrictive.

The noble metal sensitization may be gold sensitization, platinum sensitization, palladium sensitization, iridium sensitization, or the like, and the gold sensitization is particularly preferred. A gold sensitizer is used in the gold sensitization, and specific examples thereof include chlorauric acid, potassium chloroaurate, potassium aurithiocyanate, gold sulfide, gold (I) thioglucose, and gold (I) thiomannose. The amount of the gold sensitizer per 1 mol of the silver halide may be about $10^{-7}$ to $10^{-2}$ mol. A cadmium salt, a sulfite salt, a lead salt, a thallium salt, or the like may be contained in the silver halide emulsion during the silver halide particle formation or physical ripening process.

The reduction sensitization may be carried out in the present invention. Examples of reduction sensitizers include stannous salts, amines, formamidinesulfinic acid, and silane compounds. A thiosulfonic acid compound may be added to the silver halide emulsion by a method described in European Patent (EP) Publication No. 293917. In the present invention, only one silver halide emulsion may be used for producing the photosensitive material, or alternatively a plurality of silver halide emulsions may be used in combination therefor. For example, emulsions different in average particle size, halogen composition, crystal habit, chemical sensitization condition, or sensitivity may be used in combination. It is preferred in view of increasing the contrast that an emulsion with a higher sensitivity is applied to a region closer to the support as described in Japanese Laid-Open Patent Publication No. 6-324426.

<Binder>

A binder may be used in the emulsion layer to uniformly disperse the silver salt particles and to help the emulsion layer adhere to the support. In the present invention, though the binder may contain a water-insoluble polymer and a water-soluble polymer, it is preferred that the binder has a high content of a water-soluble component that can be removed by dipping in a hot water or bringing in contact with a water vapor as described hereinafter.

Examples of the binders include gelatins, carrageenans, polyvinyl alcohols (PVA), polyvinyl pyrolidones (PVP), polysaccharides such as starches, celluloses and derivatives thereof, polyethylene oxides, polysaccharides, polyvinylamines, chitosans, polylysines, polyacrylic acids, polyalginic acids, polyhyaluronic acids, and carboxycelluloses. These binders show a neutral, anionic, or cationic property due to ionicity of a functional group.

The binder preferably comprises a gelatin. The gelatin may be a lime-treated gelatin or an acid-treated gelatin, and may be a hydrolyzed gelatin, an enzymatically decomposed gelatin, or the like (a phthalated gelatin or an acetylated gelatin having a modified amino or carboxyl group). The gelatin used in the preparation of the silver salt is preferably such that the positive charge of an amino group is converted to the uncharged or negatively charged state. It is more preferable to use the phthalated gelatin additionally.

The amount of the binder in the emulsion layer is not particularly limited, and may be appropriately selected to obtain sufficient dispersion and adhesion properties. The volume ratio of Ag/binder in the emulsion layer is preferably 1/2 or more, more preferably 1/1 or more.

<Solvent>

The solvent for forming the emulsion layer is not particularly limited, and examples thereof include water, organic solvents (e.g. alcohols such as methanol, ketones such as acetone, amides such as formamide, sulfoxides such as dimethyl sulfoxide, esters such as ethyl acetate, ethers), ionic liquids, and mixtures thereof.

In the present invention, the mass ratio of the solvent used in the emulsion layer to the total of the silver salt, the binder, and the like in the emulsion layer is 30% to 90% by mass, preferably 50% to 80% by mass.

<Antistatic Agent>

The photosensitive material according to the present invention preferably contains an antistatic agent. It is desirable that a support surface on the opposite side of the emulsion layer is coated with the antistatic agent.

A layer containing a conductive substance, which has a surface resistivity of $10^{12}$ (Ω/sq) or less in the atmosphere of 25° C. and 25% RH, can be preferably used as an antistatic layer. Preferred examples of the antistatic agents include the following conductive substances.

The antistatic agent may be a conductive substance described in Japanese Laid-Open Patent Publication No. 2-18542, from page 2, lower left column, line 13, to page 3, upper right column, line 7. Specific examples of the antistatic agents include metal oxides described in this patent publication, page 2, lower right column, lines 2 to 10; conductive high-molecular compounds P-1 to P-7 described in this patent publication; and needle-like metal oxides described in U.S. Pat. No. 5,575,957, Japanese Laid-Open Patent Publication No. 10-142738, paragraph 0045 to 0043, Japanese Laid-Open Patent Publication No. 11-223901, paragraph 0013 to 0019.

Conductive metal oxide particles used in the present invention may contain $ZnO$, $TiO_2$, $SnO_2$, $Al_2O_3$, $In_2O_3$, $MgO$, $BaO$, $MoO_3$, or a composite oxide thereof, and may further contain a dissimilar atom. The metal oxide is preferably $SnO_2$, $ZnO$, $Al_2O_3$, $TiO_2$, $In_2O_3$, or $MgO$, more preferably $SnO_2$, $ZnO$, $In_2O_3$, or $TiO_2$, particularly preferably $SnO_2$. In the case of using a small amount of the dissimilar atom, for example, the particle may contain ZnO doped with Al or In, $TiO_2$ doped with Nb or Ta, $In_2O_3$ doped with Sn, or $SnO_2$ doped with Sb, Nb, or a halogen. The amount of the dissimilar atom may be 0.01 to 30 mol %, preferably 0.1 to 10 mol %. When the amount of the dissimilar atom is less than 0.01 mol %, the atom can hardly function to sufficiently increase the conductivity of the oxide or composite oxide. When the amount is more than 30 mol %, the blackness of the particle is increased, and the antistatic layer is disadvantageously blackened. In the present invention, it is preferred that the conductive metal oxide particle contains the metal oxide or composite metal oxide and a small amount of the dissimilar atom. Also it is preferred that the particle has an oxygen defect in the crystal structure.

The fine conductive metal oxide particle containing a small amount of the dissimilar atom is preferably an $SnO_2$ particle doped with antimony, particularly an $SnO_2$ particle doped with 0.2 to 2.0 mol % of antimony.

The shape of the conductive metal oxide particle used in the present invention is not particularly limited, and may be a granular or needle-like shape, etc. The average particle size of the particle is 0.5 to 25 μm in spherical equivalent diameter.

A soluble salt (such as a chloride or a nitrate), a vapor-deposited metal layer, an ionic polymer as described in U.S. Pat. Nos. 2,861,056 and 3,206,312, an insoluble inorganic salt as described in U.S. Pat. No. 3,428,451, etc. may be used to improve the conductivity.

The antistatic layer containing such a conductive metal oxide particle is preferably formed as an undercoat layer for the back surface or the emulsion layer, etc. The amount of the antistatic layer is preferably 0.01 to 1.0 g/m² in the total of both sides.

The photosensitive material preferably has a volume resistivity of $1.0 \times 10^7$ to $1.0 \times 10^{12}$ (Ω·cm) under the atmosphere of 25° C. and 25% RH.

In the present invention, the above conductive substance may be used in combination with a fluorine-containing surfactant, described in Japanese Laid-Open Patent Publication No. 2-18542, from page 4, upper right column, line 2, to page 4, lower right column, the third line from the bottom, or Japanese Laid-Open Patent Publication No. 3-39948, from page 12, lower left column, line 6, to page 13, lower right column, line 5, to further improve the antistatic property.

<Other Additives>

Various additives can be used in the photosensitive material according to the present invention with no particular restrictions. Preferred examples of the additives include the following ones described in patent publications and the like.

(1) Nucleation Accelerator

Nucleation accelerators include compounds represented by the general formula (I), (II), (III), (IV), (V), or (VI) of Japanese Laid-Open Patent Publication No. 6-82943, compounds represented by the general formula (II-m) to (II-p) and example compounds II-1 to II-22 of Japanese Laid-Open Patent Publication No. 2-103536, from page 9, upper right column, line 13, to page 16, upper left column, line 10, and compounds described in Japanese Laid-Open Patent Publication No. 1-179939.

(2) Spectral Sensitizing Dye

Spectral sensitizing dyes include those described in Japanese Laid-Open Patent Publication No. 2-12236, from page 8, lower left column, line 13, to page 8, lower right column, line 4, Japanese Laid-Open Patent Publication No. 2-103536, from page 16, lower right column, line 3, to page 17, lower left column, line 20, and Japanese Laid-Open Patent Publication Nos. 1-112235, 2-124560, 3-7928, and 5-11389.

(3) Surfactant

Surfactants include those described in Japanese Laid-Open Patent Publication No. 2-12236, from page 9, upper right column, line 7, to page 9, lower right column, line 7, and Japanese Laid-Open Patent Publication No. 2-18542, from page 2, lower left column, line 13, to page 4, lower right column, line 18.

(4) Antifoggant

Antifoggants include thiosulfinic acid compounds described in Japanese Laid-Open Patent Publication No. 2-103536, from page 17, lower right column, line 19, to page 18, upper right column, line 4, and page 18, lower right column, lines 1 to 5, and Japanese Laid-Open Patent Publication No. 1-237538.

(5) Polymer Latex

Polymer latexes include those described in Japanese Laid-Open Patent Publication No. 2-103536, page 18, lower left column, lines 12 to 20.

(6) Compound Having Acid Group

Compounds having an acid group include those described in Japanese Laid-Open Patent Publication No. 2-103536, from page 18, lower right column, line 6, to page 19, upper left column, line 1.

(7) Film Hardening Agent

Film hardening agents include compounds described in Japanese Laid-Open Patent Publication No. 2-103536, page 18, upper right column, lines 5 to 17.

(8) Black Pepper Inhibitor

A black pepper inhibitor may be used to inhibit generation of developed silver dots in an unexposed area, and examples thereof include compounds described in U.S. Pat. No. 4,956,257 and Japanese Laid-Open Patent Publication No. 1-118832.

(9) Redox Compound

Redox compounds include compounds represented by the general formula (I) (particularly example compounds 1 to 50) of Japanese Laid-Open Patent Publication No. 2-301743, compounds represented by the general formula (R-1), (R-2), or (R-3) and example compounds 1 to 75 described in Japanese Laid-Open Patent Publication No. 3-174143, pages 3 to 20, and compound described in Japanese Laid-Open Patent Publication Nos. 5-257239 and 4-278939.

(10) Monomethine Compound

Monomethine compounds include compounds represented by the general formula II) particularly example compounds II-1 to II-26) of Japanese Laid-Open Patent Publication No. 2-287532.

(11) Dihydroxybenzene Compound

Dihydroxybenzene compounds include compounds described in Japanese Laid-Open Patent Publication No. 3-39948, from page 11, upper left column, to page 12, lower left column, and European Patent Publication No. 452772A.

[Non-photosensitive Intermediate Layer]

The non-photosensitive intermediate layer may contain a gelatin or a combination of a gelatin and an SBR. Further the intermediate layer may contain an additive such as a crosslinking agent or a surfactant.

[Other Layers]

A protective layer may be formed on the emulsion layer. The protective layer used in the present invention comprises a binder such as a gelatin or a high-molecular polymer, and is formed on the photosensitive emulsion layer to improve the scratch prevention or mechanical property. The thickness of the protective layer is preferably 0.3 μm or less. The method of applying or forming the protective layer is not particularly limited, and may be appropriately selected from known coating methods.

<Conductive Film Production Method>

A method for producing the conductive film using the above photosensitive material will be described below.

In the conductive film production method of the present invention, first the photosensitive material comprising the support and thereon the emulsion layer containing the silver salt is exposed and developed. Then, the metallic silver portion formed by the development is subjected to the smoothing treatment such as a calender treatment. In the metallic silver portion formation step, the light-transmitting portion or the insulating portion may be formed in addition to the metallic silver portion, or alternatively the metallic silver portion may be formed on the entire film surface by entire surface exposure. In the conductive film according to the present invention, the metal portion may be formed on the support by pattern exposure. In the pattern exposure, a scanning exposure method or a surface exposure method may be used. The metallic silver portion may be formed in an exposed area or an unexposed area.

For example, the pattern may be a mesh pattern for producing an electromagnetic wave-shielding film or a wiring pattern for producing a printed board. The more detailed pattern shape may be appropriately selected depending on the intended use.

The conductive film production method of the present invention includes the following three embodiments, different in the photosensitive materials and development treatments.

(1) An embodiment comprising subjecting a photosensitive black-and-white silver halide material free of physical development nuclei to a chemical or thermal development, to form the metallic silver portion on the material.

(2) An embodiment comprising subjecting a photosensitive black-and-white silver halide material having a silver halide emulsion layer containing a physical development nucleus to a solution physical development, to form the metallic silver portion on the material.

(3) An embodiment comprising subjecting a stack of a photosensitive black-and-white silver halide material free of physical development nuclei and an image-receiving sheet having a non-photosensitive layer containing a physical development nucleus to a diffusion transfer development, to form the metallic silver portion on the non-photosensitive image-receiving sheet.

In the embodiment of (1), an integral black-and-white development-type method is used to form a light-transmittable conductive film such as a light-transmitting electromagnetic wave-shielding film or a printed wiring conductive film, on the photosensitive material. The resulting developed silver is a chemically or thermally developed silver comprising a high-specific surface area filament, and shows a high activity in the following plating treatment or physical development.

In the embodiment of (2), silver halide particles are melted around the physical development nucleus and deposited on the nucleus in an exposed area, to form a light-transmittable conductive film such as a light-transmitting electromagnetic wave-shielding film or a light-transmitting conductive film or a printed wiring conductive film, on the photosensitive material. Also in this embodiment, an integral black-and-white development-type method is used. Though high activity can be achieved since the silver halide is deposited on the physical development nucleus in the development, the developed silver has a spherical shape with small specific surface.

In the embodiment of (3), silver halide particles are melted in an unexposed area, and diffused and deposited on the development nucleus of the image-receiving sheet, to form a light-transmittable conductive film such as a light-transmitting electromagnetic wave-shielding film or a light-transmitting conductive film or a printed wiring conductive film, on the image-receiving sheet. In this embodiment, a so-called separate-type method is used, and the image-receiving sheet is peeled off from the photosensitive material.

A negative development treatment or a reversal development treatment can be used in the embodiments. In a diffusion transfer development, the negative development treatment can be carried out using an auto-positive photosensitive material.

The chemical development, thermal development, solution physical development, and diffusion transfer development have the meanings generally known in the art, and are explained in common photographic chemistry texts such as Shin-ichi Kikuchi, "*Shashin Kagaku (Photographic Chemistry)*", Kyoritsu Shuppan Co., Ltd. and C. E. K. Mees, "*The Theory of Photographic Process,* 4th ed."

[Exposure]

In the production method according to the present invention, the silver salt-containing layer formed on the support is exposed. The layer may be exposed using an electromagnetic wave. For example, the electromagnetic wave may comprise a light such as a visible light or an ultraviolet light, or a radiation ray such as an X-ray. The exposure may be carried out using a light source having a wavelength distribution or a specific wavelength. The irradiation light may be applied in a mesh pattern for producing an electromagnetic wave-shielding film or a wiring pattern for producing a printed board.

For example, the photosensitive material may be subjected to scanning exposure using a cathode ray tube (CRT) as the light source. As compared with laser exposure apparatus, the cathode ray tube exposure apparatus is simpler, more compact, and lower-cost. Further the light axis and the light color can be controlled more easily in the cathode ray tube exposure apparatus. In the cathode ray tube for the image exposure, an illuminant capable of emitting a light in a spectral region may be selected depending on the intended use. For example, red illuminants, green illuminants, and blue illuminants may be used singly or in combination as the light source. The spectral region is not limited to the red, green, and blue regions, and may be the yellow, orange, purple, or infrared region. Particularly a white light-emitting cathode ray tube, obtained by combining the illuminants, is often used as the light source. Further, an ultraviolet lamp is preferred, and a mercury lamp emitting a g- or i-ray may be used, as the light source.

In the production method of the present invention, various laser beams may be used in the exposure. For example, in the exposure in the present invention, a monochromatic high-density light of a gas laser, a light-emitting diode, a semiconductor laser, or a second harmonic generation (SHG) light source containing a nonlinear optical crystal in combination with a semiconductor laser or a solid laser using a semiconductor laser as an excitation source, etc. is preferably used for the scanning exposure. Further, a KrF excimer laser, an ArF excimer laser, an F2 laser, or the like may be used in the exposure.

The pattern exposure of the silver salt-containing layer may be carried out using a surface exposure method using a photomask or a scanning exposure method using a laser beam. In the methods, a refraction exposure process using a lens or a reflection exposure process using a reflecting mirror may be used, and various exposure treatments such as contact exposure, proximity exposure, reduced projection exposure, and reflecting projection exposure treatments may be carried out.

[Development Treatment]

In the production method of the present invention, the silver salt-containing layer is subjected to a development treatment after the exposure. Common development technologies for photographic silver salt films, photographic papers, print engraving films, emulsion masks for photomasking, etc. may be used in the development treatment. A developer for the development treatment is not particularly limited, and may be a PQ developer, an MQ developer, an MAA developer, etc. Examples of commercially available developers usable in the invention include CN-16, CR-56, CP45X, FD-3, and PAPITOL available from FUJIFILM Corporation; C-41, E-6, RA-4, Dsd-19, and D-72 available from Eastman Kodak Company; and developers contained in kits thereof. The developer may be a lith developer such as D85 available from Eastman Kodak Company.

In the production method of the present invention, by the exposure and development treatments, the metallic silver portion is formed in the exposed area, and the light-transmitting portion to be hereinafter described is formed in the unexposed area. By water-washing the sample to remove a binder following the development treatment, the conductivity of the film may be increased if necessary. In the present invention, the development, the fixation, and the water washing are preferably carried out at a temperature of 25° C. or lower.

In the production method of the present invention, the development process may contain a fixation treatment for removing the silver salt in the unexposed area to stabilize the material. The fixation treatment may be carried out using common fixation technologies for photographic silver salt films, photographic papers, print engraving films, emulsion masks for photomasking, etc.

The developer for the development treatment may contain an image quality improver for improving the image quality. Examples of the image quality improvers include nitrogen-containing heterocyclic compounds such as benzotriazole. In the case of using the lith developer, a polyethylene glycol is particularly preferably used.

The ratio of the mass of the metallic silver contained in the exposed area after the development to the mass of the silver contained in this area before the exposure is preferably 50% by mass or more, more preferably 80% by mass or more. When the ratio is 50% by mass or more, a high conductivity can be easily achieved.

After the development treatment, the metallic silver portion in the exposed area contains silver and a non-conductive polymer, and the volume ratio of Ag/non-conductive polymer is preferably 2/1 or more, more preferably 3/1 or more.

In the present invention, a tone obtained by the development is preferably more than 4.0, though not particularly restrictive. When the tone after the development is more than 4.0, the conductivity of the conductive metal portion can be increased while maintaining high transparency of the light-transmitting portion. For example, the tone of 4.0 or more can be achieved by the above mentioned doping with rhodium or iridium ion.

[Oxidation Treatment]

In the production method of the present invention, the metallic silver portion formed by the development treatment is preferably subjected to an oxidation treatment. For example, a small amount of a metal deposited on the light-transmitting portion can be removed by the oxidation treatment, so that the transmittance of the light-transmitting portion can be increased to approximately 100%.

The oxidation treatment may be carried out by a known method using an oxidant such as Fe (III) ion. The oxidation treatment may be carried out after the exposure and development treatments of the silver salt-containing layer.

In the present invention, the metallic silver portion may be treated with a Pd-containing solution after the exposure and development treatments. The Pd may be in the state of divalent palladium ion or metal palladium. A black color of the metallic silver portion can be prevented from changing with time by this treatment.

In the production method of the present invention, the mesh metallic silver portion having particular line width, opening ratio, and Ag content is formed directly on the support by the exposure and development treatments, and thereby can exhibit a sufficient surface resistivity. Therefore, it is unnecessary to subject the metallic silver portion to further physical development and/or plating to increase the conductivity. Thus, in the invention, the light-transmitting electromagnetic wave-shielding film can be produced by the simple process.

As described above, the light-transmitting electromagnetic wave-shielding film according to the present invention can be suitably used in a plasma display panel. Thus, the plasma display panel containing the light-transmitting electromagnetic wave-shielding film of the present invention is excellent in electromagnetic wave-shielding ability, contrast, and brightness, and can be produced at low cost.

[Reduction Treatment]

A desirable film with high conductivity can be obtained by dipping the photosensitive material in an aqueous reducing solution after the development treatment.

The aqueous reducing solution may be an aqueous solution of sodium sulfite, hydroquinone, p-phenylenediamine, oxalic acid, etc. The aqueous solution preferably has a PH of 10 or more.

[Smoothing Treatment]

In the production method of the present invention, the metallic silver portion (the entire surface metallic silver portion, the patterned metal mesh portion, or the patterned metal wiring portion) is subjected to a smoothing treatment after the development treatment. The conductivity of the metallic silver portion can be significantly increased by the smoothing treatment. When the areas of the metallic silver portion and the light-transmitting portion are appropriately designed, the resultant light-transmitting electromagnetic wave-shielding film can be high in both the electromagnetic wave-shielding property and the light transmittability and can have the black mesh portion, and the resultant printed board can be high in both the conductivity and insulating property without pinholes.

The smoothing treatment may be carried out using a calender roll unit. The calender roll unit generally has a pair of rolls. The smoothing treatment using the calender roll unit is hereinafter referred to as the calender treatment.

The roll used in the calender treatment may be composed of a metal or a plastic such as an epoxy, a polyimide, a polyamide, or a polyimide-amide. Particularly in a case where the photosensitive material has the emulsion layer on both sides, it is preferably treated by using a pair of the metal rolls. In a case where the photosensitive material has the emulsion layer only on one side, it may be treated by using the metal roll and the plastic roll in combination in view of preventing wrinkling. The lower limit of the line pressure is preferably 1960 N/cm (200 kgf/cm, corresponding to a surface pressure of 699.4 kgf/cm$^2$) or more, more preferably 2940 N/cm (300 kgf/cm, corresponding to a surface pressure of 935.8 kgf/cm$^2$) or more. The upper limit of the line pressure is preferably 6860 N/cm (700 kgf/cm) or less.

The temperature, at which the smoothing treatment is carried out using typically the calender roll unit, is preferably 10° C. (without temperature control) to 100° C. Though the preferred temperature range is different depending on the density and shape of the mesh or wiring pattern of the metal, the type of the binder, etc., in general the temperature is more preferably 10° C. (without temperature control) to 50° C.

As described above, the high-conductive film having a surface resistivity of 2.5 (Ω/sq) or less can be easily produced with low costs by the production method of the present invention.

Thus, in the conductive film production method of the present invention, by exposing and developing the photosensitive material having the support and thereon the silver salt-containing layer to form the metallic silver portion containing 0.1 to 10 g/m$^2$ of silver on the support, the conductive film having a surface resistance of 1.9 or less can be obtained without forming a further conductive layer on the metallic silver portion.

[Treatment of Dipping in Hot Water or Bringing into Contact with Water Vapor]

In the production method of the present invention, after the conductive metal portion is formed on the support, the support with the conductive metal portion formed thereon may be dipped in a hot water or a heated water having a higher temperature than the hot water, or may be brought into contact with a water vapor. By this treatment, the conductivity and the transparency can be easily improved in a short time. It is considered that the water-soluble binder is partly removed, whereby bindings between the metals (the conductive substances) are increased.

This treatment may be carried out after the development treatment, and is desirably carried out after the smoothing treatment.

The temperature of the hot water or the heated water having a higher temperature than the hot water, in which the support is dipped, is preferably 60° C. to 100° C., more preferably 80° C. to 100° C. The temperature of the water vapor, with which the support is brought into contact, is preferably 100° C. to 140° C. at 1 atm. The time of the treatment of dipping in the hot water or the heated water having a higher temperature than the hot water or bringing into contact with the water vapor depends on the type of the water-soluble binder used. When the support has a size of 60 cm×1 m, the treatment time is preferably about 10 seconds to 5 minutes, more preferably about 1 to 5 minutes.

[Plating Treatment]

In the present invention, the metallic silver portion may be subjected to the smoothing treatment, and may be subjected to a plating treatment. By the plating treatment, the surface resistance can be further reduced, and the conductivity can be further increased. The smoothing treatment may be carried out before or after the plating treatment. When the smoothing treatment is carried out before the plating treatment, the plating treatment can be more efficiently carried out to form a uniform plated layer. The plating treatment may be an electrolytic plating treatment or an electroless plating treatment. The material for the plated layer is preferably a metal with a sufficient conductivity such as copper.

The present invention may be combined without departing from the scope of the invention with technologies disclosed in the following patent publications: Japanese Laid-Open Patent Publication Nos. 2004-221564, 2004-221565, 2006-012935, 2006-010795, 2006-228469, 2006-228473, 2006-228478, 2006-228480, 2006-228836, 2006-267627, 2006-269795, 2006-267635, 2006-286410, 2006-283133, and 2006-283137.

EXAMPLE 1

The present invention will be described more specifically below with reference to Examples. Materials, amounts, ratios, treatment contents, treatment procedures, and the like, used in Examples, may be appropriately changed without departing from the scope of the invention. The following specific examples are, therefore, to be considered in all respects as illustrative and not restrictive.

EXAMPLES 1 TO 14

(Preparation of Emulsion A)

| Liquid 1 | |
|---|---|
| Water | 750 ml |
| Phthalated gelatin | 20 g |
| Sodium chloride | 3 g |
| 1,3-Dimethylimidazolidine-2-thione | 20 mg |
| Sodium benzenethiosulfonate | 10 mg |
| Citric acid | 0.7 g |
| Liquid 2 | |
| Water | 300 ml |
| Silver nitrate | 150 g |
| Liquid 3 | |
| Water | 300 ml |
| Sodium chloride | 38 g |
| Potassium bromide | 32 g |
| Potassium hexachloroiridate (III) (0.005% KCl, 20% aqueous solution) | 5 ml |
| Ammonium hexachlororhodate (0.001% NaCl, 20% aqueous solution) | 7 ml |

The potassium hexachloroiridate (III) (0.005% KCl, 20% aqueous solution) and the ammonium hexachlororhodate (0.001% NaCl, 20% aqueous solution) in Liquid 3 were prepared by dissolving a complex powder in a 20% aqueous solution of KCl or a 20% aqueous solution of NaCl, respectively, and by heating the resultant solution at 40° C. for 120 minutes respectively.

Liquid 1 was maintained at 38° C. and pH 4.5, and Liquids 2 and 3 were simultaneously added in an amount of 90% of the total to Liquid 1 over 20 minutes under stirring, to form 0.16-μm nuclear particles. Then, Liquids 4 and 5 described below were added thereto over 8 minutes, and residual 10% of Liquids 2 and 3 were added over 2 minutes, so that the nuclear particles were grown to 0.21 μm. Further 0.15 g of potassium iodide was added, and the resulting mixture was ripened for 5 minutes, whereby the particle formation was completed.

| Liquid 4 | |
|---|---|
| Water | 100 ml |
| Silver nitrate | 50 g |
| Liquid 5 | |
| Water | 100 ml |
| Sodium chloride | 13 g |
| Potassium bromide | 11 g |
| Yellow prussiate of potash | 5 mg |

The particles were water-washed by a common flocculation method. Specifically, the temperature was lowered to 35° C., and the pH was lowered by sulfuric acid until the silver halide was precipitated (within a pH range of 3.6±0.2). About 3 L of the supernatant solution was removed (first water washing). Further 3 L of a distilled water was added thereto, and sulfuric acid was added until the silver halide was precipitated. 3 L of the supernatant solution was removed again (second water washing). The procedure of the second water washing was repeated once more (third water washing), whereby the water washing and demineralization process was completed. After the water washing and demineralization process, the obtained emulsion was controlled at a pH of 6.4 and a pAg of 7.5. 100 mg of a stabilizer of 1,3,3a,7-tetraazaindene and 100 mg of an antiseptic agent of PROXEL (trade name, available from ICI Co., Ltd.) were added thereto, to obtain a final emulsion of cubic silver iodochlorobromide particles, which contained 70 mol % of silver chloride and 0.08 mol % of silver iodide, and had an average particle diameter of 0.22 μm and a variation coefficient of 9%. The final emulsion had pH of 6.4, pAg of 7.5, a conductivity of 4000 μS/cm, a density of $1.4 \times 10^3$ kg/m$^3$, and a viscosity of 20 mPa·s.

(Preparation of Emulsion B)

Emulsion B was prepared in the same manner as Emulsion A except that an inactive gelatin (a non-phthalated gelatin) was used as the gelatin in Liquid 1 and 3 g of the following anionic precipitating agent-1 was added after the particle formation.

(Preparation of Emulsion B')

Emulsion B' was prepared in the same manner as Emulsion B except that the amount of the gelatin in Liquid 1 was increased threefold and also the amount of the anionic precipitating agent-1 was increased threefold after the particle formation.

(Preparation of Emulsion C)

Emulsion C was prepared in the same manner as Emulsion B except for adding 1.5 g of the anionic precipitating agent-1.

(Preparation of Emulsion D)

Emulsion D was prepared in the same manner as Emulsion A except that $10^{-3}$ mol/mol silver of 1,3,3a,7-tetraazaindene was added after the particle formation but before the water washing and demineralization.

The emulsion was applied onto a PET film by spin coating, and the existence of aggregates was examined.

A carbon replica-type transmission electron microscope photograph of the emulsion was observed to examine the particle shape. The results are shown in Table 1.

PRECIPITATING AGENT-1

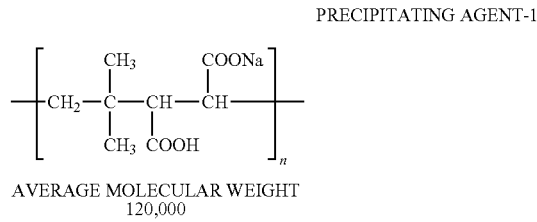

AVERAGE MOLECULAR WEIGHT
120,000

TABLE 1

| Emulsion No. | Haze of Supernatant in Water Washing | Aggregate | Particle Diameter Change by Water Washing and Demineralization | Note |
|---|---|---|---|---|
| A | Excellent (Not Hazed) | Not Generated | Good (Changed by 5% or Less) | Present Invention |
| B | Excellent (Not Hazed) | Generated | Good (Changed by 5% or Less) | Reference Example |
| B' | Excellent (Not Hazed) | Not Generated | Good (Changed by 5% or Less) | Reference Example |
| C | Good (Slightly Hazed) | Generated | Good (Changed by 5% or Less) | Reference Example |
| D | Excellent (Not Hazed) | Not Generated | Excellent (Not Changed) | Present Invention |

As shown in Table 1, though Emulsion B' contained no aggregates, Emulsion B' had a low silver/binder ratio and thereby was not suitable for conductive film production. Emulsion B having a high silver/binder ratio contained aggregates. This problem could be solved by using Emulsion A according to the present invention. Emulsion D had more preferable properties.

(Preparation of Emulsion E)

Emulsion E was prepared in the same manner as Emulsion A except that the gelatin amount of Liquid 1 was 8 g.

(Preparation of Emulsion F)

Emulsion F was prepared in the same manner as Emulsion A except that the gelatin amount of Liquid 1 was 16 g.

(Preparation of Emulsion Z)

Emulsion Z was prepared in the same manner as Emulsion A except that the gelatin amount of Liquid 1 was 34 g and the amount of the ammonium hexachlororhodate in Liquid 3 was reduced to increase the sensitivity.

(Production of Coating Sample)

$8.0 \times 10^{-4}$ mol/mol Ag of the compound (Cpd-1) and $1.2 \times 10^{-4}$ mol/mol Ag of 1,3,3a,7-tetraazaindene were added to each of Emulsions A and E, and the resultant mixture was well mixed. Then, the compound (Cpd-2) was added to the mixture to control the swelling ratio if necessary, and the pH of the coating liquid was controlled to 5.6 using citric acid.

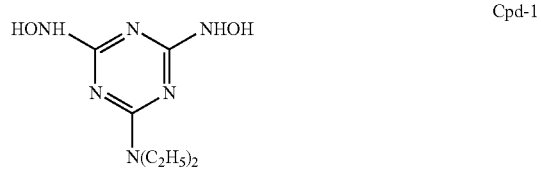

Cpd-1

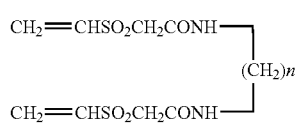

Cpd-2

$(n = 2):(n = 3) = 3:1$

The emulsion layer coating liquid prepared as above from Emulsion A was applied to a polyethylene terephthalate (PET) at an Ag density of 5 g/m² and a gelatin density of 0.4 g/m², and was dried to obtain Coating sample A.

The emulsion layer coating liquid prepared as above from Emulsion E was applied to a polyethylene terephthalate (PET) at an Ag density of 5 g/m² and a gelatin density of 0.16 g/m², and was dried to obtain Coating sample E. The surface of the PET was hydrophilized beforehand.

In Coating sample A, the emulsion layer had an Ag/binder volume ratio (silver/GEL ratio (vol)) of 1.6/1. In Coating sample D, the emulsion layer had an Ag/binder volume ratio (silver/GEL ratio (vol)) of 2/1. In Coating sample E, the emulsion layer had an Ag/binder volume ratio (silver/GEL ratio (vol)) of 4/1. Thus, the emulsion layers satisfied the Ag/binder ratio condition of 1/1 or more, which is preferably used in the photosensitive material for forming the conductive film according to the present invention.

(Exposure and Development)

Next, the dried coating film was exposed to a parallel light from a light source of a high-pressure mercury lamp, through a photomask having a lattice-patterned space (line/space=195 μm/5 μm (pitch 200 μm)). The photomask was capable of forming a lattice-patterned developed silver image (line/space=5 μm/195 μm). Then the coating was subjected to a treatment containing development, fixation, water washing, and drying.

[Developer Composition A]

| 1 L of the developer contained the following compounds. | |
|---|---|
| Hydroquinone | 15 g/L |
| Sodium sulfite | 30 g/L |
| Potassium carbonate | 40 g/L |
| Ethylenediamine tetraacetate | 2 g/L |
| Potassium bromide | 3 g/L |
| Polyethylene glycol 2000 | 1 g/L |
| Potassium hydroxide | 4 g/L |
| PH | Controlled at 10.5 |

[Developer Composition B]

Developer composition B was such that the polyethylene glycol 2000 was removed from Developer composition A.

[Fixer Composition A]

| 1 L of the fixer contained the following compounds. | |
|---|---|
| Ammonium thiosulfate (75%) | 300 ml |
| Ammonium sulfite monohydrate | 25 g/L |
| 1,3-Diaminopropane tetraacetate | 8 g/L |
| Acetic acid | 5 g/L |
| Aqueous ammonia (27%) | 1 g/L |
| Potassium iodide | 2 g/L |
| PH | Controlled at 6.2 |

[Fixer Composition B]

| 1 L of the fixer contained the following compounds. | |
|---|---|
| Potassium thiocyanate | 200 g/L |
| PH | Controlled at 6.2 |

(Reduction Treatment)

The above developed sample was dipped in a 10 wt % aqueous sodium sulfite solution kept at 40° C. for 10 minutes.

(Calender Treatment)

The above developed sample was subjected to a calender treatment. A calender roll unit had metal rollers (composed of an iron core and a plated hard chrome, roll diameter 250 mm), and the sample was moved between the rollers under a line pressure of 1960 N/cm (200 kg/cm) to 7840 N/cm (800 kg/cm). The surface resistivity (Wsq) of the sample was measured before and after the treatment.

PRODUCTION OF EXAMPLES 1 TO 12

Coating samples A and E were subjected to the following process to produce samples of Examples 1 to 12.

Process A: Development→Fixation→Water washing→Drying→Calender treatment (Examples 1 and 7)

Process B: Development→Water washing→Drying→Fixation→Water washing→Drying→Calender treatment (Examples 2 to 5 and 8 to 11)

Process C: Development→Water washing→Drying→Calender treatment→Fixation→Water washing→Drying (Examples 6 and 12)

The results are shown in Table 2. Also the reduction treatment and the compositions of the developer and fixer are shown in Table 2.

TABLE 2

| Sample | Coating sample | Treatment process | Reduction | (i) | (ii) | Silver/GEL ratio (vol) | Calender pressure (kgf/cm) | Line width (μm) | Pitch (μm) | Opening ratio (%) | Surface resistivity (Ω/sq) | Note |
|---|---|---|---|---|---|---|---|---|---|---|---|---|
| Example 1 | A | Process A | Not Performed | A | B | 1.6/1 | 400 | 16 | 200 | 86 | 7.8 | Present Invention |
| Example 2 | A | Process B | Not Performed | A | B | 1.6/1 | 400 | 16 | 200 | 86 | 5.6 | Present Invention |
| Example 3 | A | Process B | Performed | A | B | 1.6/1 | 400 | 16 | 200 | 86 | 5.3 | Present Invention |
| Example 4 | A | Process B | Performed | B | B | 1.6/1 | 400 | 16 | 200 | 86 | 7.4 | Present Invention |
| Example 5 | A | Process B | Performed | A | A | 1.6/1 | 400 | 16 | 200 | 86 | 6.9 | Present Invention |
| Example 6 | A | Process C | Not Performed | A | B | 1.6/1 | 400 | 16 | 200 | 86 | 4.8 | Present Invention |

TABLE 2-continued

| Sample | Coating sample | Treatment process | Reduction | (i) | (ii) | Silver/GEL ratio (vol) | Calender pressure (kgf/cm) | Line width (μm) | Pitch (μm) | Opening ratio (%) | Surface resistivity (Ω/sq) | Note |
|---|---|---|---|---|---|---|---|---|---|---|---|---|
| Example 7 | E | Process A | Not Performed | A | B | 4/1 | 400 | 16 | 200 | 86 | 3.6 | Present Invention |
| Example 8 | E | Process B | Not Performed | A | B | 4/1 | 400 | 16 | 200 | 86 | 2.3 | Present Invention |
| Example 9 | E | Process B | Performed | A | B | 4/1 | 400 | 16 | 200 | 86 | 2.1 | Present Invention |
| Example 10 | E | Process B | Performed | B | B | 4/1 | 400 | 16 | 200 | 86 | 3 | Present Invention |
| Example 11 | E | Process B | Performed | A | A | 4/1 | 400 | 16 | 200 | 86 | 2.7 | Present Invention |
| Example 12 | E | Process C | Not Performed | A | B | 4/1 | 400 | 16 | 200 | 86 | 2 | Present Invention |

Note:
(i) Developer Composition
(ii) Fixer Composition

It is clear from Table 2 that the developed silver of each of Examples 1 to 12 had preferable high conductivity.

PRODUCTION OF EXAMPLE 13

As shown in Table 3 hereinafter, samples having an Ag content of 10.5 g/m² were produced using the coating liquid prepared from Emulsion E. The samples were subjected to Process B using Developer composition A and Fixer composition B, and were calender-treated under a calender load of 400 kgf/cm². The sample of Example 13 contained only the emulsion. The sample of Example 14 was prepared by adding 0.19 g/m² of a kappa carrageenan to the emulsion. The samples of Examples 15 to 17 were each prepared by forming a protective layer on the emulsion layer. The average molecular weight of gelatin used in the protective layer was about $190 \times 10^3$ in Example 15, about $33 \times 10^3$ in Example 16, and about $21 \times 10^3$ in Example 17. The samples of Examples 18 to 20 were each prepared by adding 0.19 g/m² of a kappa carrageenan with respect to Ag to the emulsion of Examples 15 to 17.

The samples were evaluated by microscope observation. The number of black peppers generated in openings in 300 μm-square area was measured.

TABLE 3

| | Protective layer | | | |
|---|---|---|---|---|
| Sample | Existence | Average Molecular Weight of Gelatin | Kappa Carrageenan | Line Width (μm) | Number of Black Pepper |
| Example 13 | Not Formed | — | Not Added | 21.2 | 20 |
| Example 14 | Not Formed | — | Added | 21.9 | 11 |
| Example 15 | Formed | $190 \times 10^3$ | Not Added | 19.9 | 18 |
| Example 16 | Formed | $133 \times 10^3$ | Not Added | 20.7 | 16 |
| Example 17 | Formed | $21 \times 10^3$ | Not Added | 21.2 | 1 |
| Example 18 | Formed | $190 \times 10^3$ | Added | 23.1 | 6 |
| Example 19 | Formed | $133 \times 10^3$ | Added | 22.5 | 5 |
| Example 20 | Formed | $21 \times 10^3$ | Added | 21.6 | 0 |

The black pepper is observed as a surface defect, and a less black pepper number is preferred. As is clear from Examples 13 and 14, the black pepper number could be reduced by adding the kappa carrageenan. As is clear from Examples 13 and 15 to 17, the formation of the protective layer was preferred. As is clear from Examples 13 and 18 to 20, it was more preferred that the protective layer and the kappa carrageenan were both used. The gelatin having a low molecular weight was preferably used in the protective layer.

PRODUCTION OF EXAMPLES 21 TO 43, SEE TABLES 4 AND 5

(Production of Coating Sample)

$8.0 \times 10^{-4}$ mol/mol Ag of the compound (Cpd-1) and $1.2 \times 10^{-4}$ mol/mol Ag of 1,3,3a,7-tetraazaindene were added to each of Emulsions A, E, and F, and the resultant mixture was well mixed. Then, the compound (Cpd-2) was added to the mixture to control the swelling ratio if necessary, and the pH of the coating liquid was controlled to 5.6 using citric acid.

The emulsion layer coating liquid prepared as above from Emulsion A was applied to a polyethylene terephthalate (PET) at an Ag density of 10.5 g/m² and a gelatin density of 0.83 g/m², and was dried to obtain Coating sample 2A.

The emulsion layer coating liquid prepared as above from Emulsion E was applied to a polyethylene terephthalate (PET) at an Ag density of 10.5 g/m² and a gelatin density of 0.33 g/m², and was dried to obtain Coating sample 2E. The surface of the PET was hydrophilized beforehand.

The emulsion layer coating liquid prepared as above from Emulsion F was applied to a polyethylene terephthalate (PET) at an Ag density of 10.5 g/m² and a gelatin density of 0.66 g/m², and was dried to obtain Coating sample 2F. The surface of the PET was hydrophilized beforehand.

In some samples, a protective layer was formed on the silver salt emulsion layer. The components of the protective layer are illustrated below.
(Protective Layer)

| | |
|---|---|
| Gelatin | 0.135 g/m² |
| Water | 8.21 g/m² |
| Surfactant | 0.015 g/m² |
| Antiseptic agent | 0.003 g/m² |

The dry thickness was 0.15 μm.

[Coating with Underlayer of Silver Salt Emulsion Layer Having Silver/Binder Ratio of 1.5/1 or Less]
(Preparation of Underlayer Coating Liquid)

$8.0 \times 10^{-4}$ mol/mol Ag of the compound (Cpd-1) and $1.2 \times 10^{-4}$ mol/mol Ag of 1,3,3a,7-tetraazaindene were added to Emulsion Z, and the resultant mixture was well mixed. Then, the pH of the coating liquid was controlled to 5.6 using citric acid.

In some samples (Examples 28, 36, and 43), the above emulsion layer coating liquid was applied to a polyethylene terephthalate (PET) at an Ag density of 2 g/m² under the silver salt emulsion layer. The samples were subjected to Process B using Developer composition A and Fixer composition B, and were further subjected to the following treatment.
(Treatment of Dipping in Hot Water and Water Vapor)

Some of the samples, subjected to the calender treatment in the same manner as Examples 1 to 12, were dipped in hot water or water vapor. Each sample was dipped in the hot water having a temperature of 90° C. for 1 to 10 minutes, or dipped in the water vapor having a temperature of 100° C. for 0.5 to 1 minute.

The surface resistivity (Ω/sq) of the samples was measured before and after the treatment of dipping in the hot water or water vapor. The relations between the sample numbers and the treatment conditions are summarized in Tables 4 to 7. The samples of Comparative Examples 1 to 3 were produced in the same manner as the samples of Examples 21 to 23 except for not performing the calender treatment.

In the sample of Example 23 produced using Coating sample 2E, the metallic silver portion had an Ag/non-conductive polymer volume ratio of 3.1/1, a density of 8.5 g/cm³, and a thickness of 1.2 μm. Thus, the metallic silver portion satisfied the Ag/non-conductive polymer volume ratio condition of 3/1 or more and the thickness condition of 0.5 to 5 μm, which are preferably used in the conductive film of the present invention.
(Blackening Treatment)

The transparent film having the mesh-shaped silver image was electroplated using a positive carbon electrode in a bath of a blackening plating solution having the following composition.

The plating solution used in the blackening plating treatment was as follows.
[Composition of Blackening Solution]

| Nickel sulfate hexahydrate | 120 g |
| Ammonium thiocyanate | 17 g |
| Zinc sulfate heptahydrate | 28 g |
| Sodium sulfate | 16 g |
| Total (added with pure water) | 1 L | pH 5.0 (controlled by sulfuric acid and sodium hydroxide)

[Plating Conditions]
Bath temperature: about 30° C.
Time: 20 seconds
Negative electrode current density: 0.1 to 0.2 A/dm² (0.03 A current was applied to the entire negative electrode (35 mm×12 cm))

The sample of Example 23 was subjected to the blackening treatment to obtain the sample of Example 27.

COMPARATIVE EXAMPLES 4 TO 7

For comparison with a technology with highest conductivity and high light transmittance among conventional ones, a metal mesh described in Japanese Laid-Open Patent Publication No. 10-41682 was produced to obtain the sample of Comparative Example 4. The metal mesh is a typical example of "etched copper mesh produced by photolithography" described above in Background Art.

This sample (Comparative Example 4) was produced in the same manner as Examples of Japanese Laid-Open Patent Publication No. 10-41682.

This sample was produced using the above photomask having a pitch of 200 μm to obtain the same mesh shape, line width, and pitch as those of the samples according to the present invention.

A metal mesh described in Japanese Patent Publication No. 42-23746 was produced to obtain the sample of Comparative Example 5. The metal mesh is a typical example of those produced by a silver salt diffusion transfer method for depositing silver on a physical development nucleus, which is one of "conductive silver formation method using silver salt" described above in Background Art. This sample (Comparative Example 5) was produced in the same manner as Example 3 of Japanese Patent Publication No. 42-23746 by the steps of applying a physical development nucleus layer and a photosensitive layer onto a hydrophilized transparent TAC (triacetyl cellulose) support, exposing the stack through a mesh-shaped photomask with a pitch of 200 μm, and developing the exposed stack using a DTR method.

Furthermore, metal meshes different in opening ratio described in Japanese Laid-Open Patent Publication No. 2000-13088 were produced to obtain the samples of Comparative Examples 6 and 7. The metal meshes are typical examples of "silver paste-printed mesh" described above in Background Art.

A metal film described in Japanese Laid-Open Patent Publication No. 2006-24485 was produced as the sample of Comparative Example 8.

TABLE 4

| | Coating Sample No. | Silver/GEL Ratio (vol) | Calender Pressure (kgf/cm) | Blackening Treatment | (i) | Protective Layer | Swelling Ratio (%) | Line Width (μm) | Pitch | Note |
|---|---|---|---|---|---|---|---|---|---|---|
| Comparative Example 1 | 2A | 1.6/1 | — | — | — | — | 250 | 15 | 200 | C* |
| Example 21 | 2A | 1.6/1 | 500 | — | — | — | 220 | 15 | 200 | P* |
| Comparative Example 2 | 2A | 1.6/1 | — | — | — | — | 250 | 9 | 200 | C* |
| Example 22 | 2A | 1.6/1 | 500 | — | — | — | 250 | 9 | 200 | P* |
| Comparative Example 3 | 2E | 4/1 | — | — | — | — | 240 | 15 | 200 | C* |
| Example 23 | 2E | 4/1 | 500 | — | — | — | 230 | 15 | 200 | P* |
| Example 24 | 2E | 4/1 | 500 | — | — | — | 100 | 15 | 200 | P* |
| Example 25 | 2E | 4/1 | 500 | — | — | — | 250 | 15 | 200 | P* |

TABLE 4-continued

| | Coating Sample No. | Silver/GEL Ratio (vol) | Calender Pressure (kgf/cm) | Blackening Treatment | (i) | Protective Layer | Swelling Ratio (%) | Line Width (μm) | Pitch | Note |
|---|---|---|---|---|---|---|---|---|---|---|
| Example 26 | 2E | 4/1 | 500 | — | — | — | 300 | 15 | 200 | P* |
| Example 27 | 2E | 4/1 | 500 | Performed | — | — | 250 | 15 | 200 | P* |
| Example 28 | 2E | 4/1 | 500 | — | Performed | — | 260 | 15 | 200 | P* |
| Comparative Example 4 | — | (ii) retest | — | — | — | — | — | 12 | 200 | C* (Etching) |
| Comparative Example 5 | — | (iii) retest | — | — | — | — | — | 15 | 200 | C* (Silver Salt) |
| Comparative Example 6 | — | (iv) retest | — | — | — | — | — | 20 | 200 | C* (Silver Paste) |
| Comparative Example 7 | | | | | | | | 20 | 300 | |
| Comparative Example 8 | — | (v) retest | — | — | — | — | Entire surface | — | | |

Note:
(i) Application of underlayer with silver/binder ratio of 1.5/1 or less
(ii) Japanese Laid-Open Patent Publication No. 10-41682
(iii) Japanese Patent Publication No. 42-23746
(iv) Japanese Laid-Open Patent Publication No. 2000-13088
(v) Japanese Laid-Open Patent Publication No. 2006-24485
C* Comparative Example
P* Present Invention

TABLE 5

| | Coating Sample No. | Silver/GEL Ratio (vol) | Calender Pressure (kgf/cm) | Blackening Treatment | Application of Underlayer with Silver/Binder Ratio of 1.5/1 or Less | Protective Layer | Swelling Ratio (%) | Line Width (μm) | Pitch | Note |
|---|---|---|---|---|---|---|---|---|---|---|
| Example 29 | 2F | 2/1 | 400 | — | — | Formed | 250 | 20 | 300 | Present Invention |
| Example 30 | 2F | 2/1 | 400 | — | — | Formed | 240 | 16.5 | 300 | Present Invention |
| Example 31 | 2F | 2/1 | 400 | — | — | Formed | 250 | 16.5 | 300 | Present Invention |
| Example 32 | 2F | 2/1 | 400 | — | — | Formed | 260 | 16.5 | 300 | Present Invention |
| Example 33 | 2F | 2/1 | 400 | — | — | Formed | 250 | 16.5 | 300 | Present Invention |
| Example 34 | 2F | 2/1 | 200 | — | — | Formed | 260 | 16.5 | 300 | Present Invention |
| Example 35 | 2F | 2/1 | 600 | — | — | Formed | 250 | 16.5 | 300 | Present Invention |
| Example 36 | 2F | 2/1 | 400 | Performed | Performed | Formed | 300 | 16.5 | 300 | Present Invention |
| Example 37 | 2E | 4/1 | 400 | — | — | Formed | 250 | 16.5 | 300 | Present Invention |
| Example 38 | 2E | 4/1 | 400 | — | — | Formed | 270 | 16.5 | 300 | Present Invention |
| Example 39 | 2E | 4/1 | 400 | — | — | Formed | 260 | 16.5 | 300 | Present Invention |
| Example 40 | 2E | 4/1 | 400 | — | — | Formed | 250 | 16.5 | 300 | Present Invention |
| Example 41 | 2E | 4/1 | 200 | — | — | Formed | 250 | 16.5 | 300 | Present Invention |
| Example 42 | 2E | 4/1 | 600 | — | — | Formed | 250 | 16.5 | 300 | Present Invention |
| Example 43 | 2E | 4/1 | 400 | Performed | Performed | Formed | 320 | 16.5 | 300 | Present Invention |

[Evaluation]

In each of thus obtained samples according to the present invention and the samples of Comparative Examples having a conductive metal portion and a light-transmitting portion, the line width of the conductive metal portion was measured to obtain the opening ratio, and the surface resistivity (Ω/sq) was measured. An optical microscope, a scanning electron microscope, and a low resistivity meter were used in each measurement.

The color of the metal portion in the mesh was visually observed. The metal portion was evaluated as "Good" when the color was black, and evaluated as "Poor" when the color was brown, gray silver, or white. Furthermore, the number of steps in the production method was evaluated. The sample was evaluated as "Good" when it was produced by 5 or less steps, and evaluated as "Poor" when it was produced by more than 5 steps.

The color of the metal portion was observed from the metal portion side and from the backside through the support, with respect to the support.

The film strength was evaluated as follows.

The surface having the mesh metal portion was scratched by a 0.1-mm-ϕ sapphire stylus at a rate of 1 cm/sec while changing the load of the sapphire stylus from 0 to 100 g. The load, under which a scratch reached the base, was used as a scale of the film strength.

Excellent: The load, at which scratch formation was started, was 80 g or more.

Good: The load, at which scratch formation was started, was 50 g or more but less than 80 g.

Poor: The load, at which scratch formation was started, was 20 g or more but less than 50 g.

The evaluation results, as well as the data, of the samples are shown in Table 4.

Furthermore, the samples of Example 21 to 43 were subjected to the following plating treatment, and the plating easiness was evaluated. Thus, the surface resistance lowering rate was measured in the plating process, and the sample that exhibited a higher lowering rate was regarded as being able to be plated at a higher plating rate.

(Plating Treatment)

The film having the mesh silver pattern formed by the above treatment was subjected to a plating treatment using an electrolytic plating unit having an electrolytic plating bath 10 shown in FIG. 1. In the electrolytic plating bath 10, a long film 12 (exposed and developed in the above manner) can be continuously plated. Arrows represent the direction of conveying the film 12. The electrolytic plating bath 10 has a plating bath 16, in which a plating solution 14 is retained. A pair of anode plates 18 parallel to each other are placed in the plating bath 16, and a pair of guide rollers 20 are rotatably disposed between the anode plates 18. The guide rollers 20 are parallel to the anode plates 18. The guide rollers 20 can be moved in the vertical direction, so that the treatment time for plating the film 12 can be controlled.

A pair of feed rollers (cathodes) 22a, 22b for introducing the film 12 into the plating bath 16 and for applying an electric current to the film 12 are rotatably disposed above the plating bath 16. Further, a draining roller 24 is rotatably disposed downward of the exit-side feed roller 22b above the plating bath 16. A water washing spray (not shown) for removing the plating solution from the film 12 is placed between the draining roller 24 and the exit-side feed roller 22b.

The anode plates 18 are connected to a plus terminal of an electrical source device (not shown) by an electrical wire (not shown), and the feed rollers 22a, 22b are connected to a minus terminal of the electrical source device.

The film 12 was disposed in the electrolytic plating unit such that the silver mesh surface faced downward (the silver mesh surface was in contact with the feed rollers 22a, 22b).

The feed rollers 22a, 22b were obtained by forming a 0.1-mm-thick electroplated copper layer on a mirror-finished stainless steel roller having a diameter of 10 cm and a length of 70 cm, and each of the guide rollers 20 and other conveying rollers was a roller having a diameter of 5 cm and a length of 70 cm with no copper plated layers. A constant treatment time could be obtained by controlling the positions of the guide rollers 20 in the height direction, regardless of the speed of the line.

The distance La shown in FIG. 1, between the plating solution surface and the lower end of the contact surface of the entry-side feed roller 22a and the silver mesh surface of the film, was 10 cm. The distance Lb shown in FIG. 1, between the plating solution surface and the lower end of the contact surface of the exit-side feed roller 22b and the silver mesh portion of the film 12, was 20 cm.

The composition of the plating solution, the dipping time (in-liquid time) in each bath, and the voltage applied to each plating bath in the plating treatment were as follows. The temperatures of the treatment liquid and washing water were 25° C.

Composition of Copper Electroplating Solution (and Replenisher Solution)

| | |
|---|---|
| Copper sulfate pentahydrate | 75 g |
| Sulfuric acid | 190 g |
| Hydrochloric acid (35%) | 0.06 ml |
| Copper Gleam PCM (available from Rohm and Haas Electric Materials) | 5 ml |
| Total (added with pure water) | 1 L |

Treatment Time and Applied Voltage in Plating Bath

| | |
|---|---|
| Water washing | 1 minute |
| Acid washing | 30 seconds |
| Plating 1 | 30 seconds, Voltage 20 V |
| Plating 2 | 30 seconds, Voltage 20 V |
| Plating 3 | 30 seconds, Voltage 20 V |
| Plating 4 | 30 seconds, Voltage 15 V |
| Plating 5 | 30 seconds, Voltage 15 V |
| Plating 6 | 30 seconds, Voltage 10 V |
| Plating 7 | 30 seconds, Voltage 10 V |
| Plating 8 | 30 seconds, Voltage 10 V |
| Plating 9 | 30 seconds, Voltage 5 V |
| Plating 10 | 30 seconds, Voltage 5 V |
| Water washing | 1 minute |
| Rust prevention | 30 seconds |
| Water washing | 1 minute |

After each step of Platings 1 to 9, the film was washed with tap water (flow rate 3 L/minute) for 30 seconds, and was dried by an electric hot-air heater to reduce the water content to 1 mL/m² or less.

TABLE 6

| | Opening Ratio (%) | Surface Resistivity Ω/sq | Hot Water/ Water Vapor Treatment Time | Number (i) of Steps | Black Color on Conductive Film Side | Black Color on Backside | Film Strength | Plating Rate | Note |
|---|---|---|---|---|---|---|---|---|---|
| Comparative Example 1 | 86 | 2.5 | — | — | Good | Good | Good | Poor | Poor | C* |
| Example 21 | 86 | 1 | — | — | Good | Good | Good | Excellent | Good | P* |
| Comparative Example 2 | 91 | 3.5 | — | — | Good | Good | Good | Poor | Poor | C* |
| Example 22 | 91 | 1.5 | — | — | Good | Good | Good | Excellent | Good | P* |
| Comparative Example 3 | 86 | 2 | — | — | Good | Good | Good | Poor | Poor | C* |

TABLE 6-continued

|  | Opening Ratio (%) | Surface Resistivity Ω/sq | Hot Water/ Water Vapor Treatment Time | Number of Steps (i) | Black Color on Conductive Film Side | Black Color on Backside | Film Strength | Plating Rate | Note |
|---|---|---|---|---|---|---|---|---|---|
| Example 23 | 86 | 0.5 | — | — Good | Good | Good | Excellent | Excellent | P* |
| Example 24 | 86 | 0.5 | — | — Good | Good | Good | Excellent | Excellent | P* |
| Example 25 | 86 | 0.5 | — | — Good | Good | Good | Excellent | Excellent | P* |
| Example 26 | 86 | 0.5 | — | — Good | Good | Good | Excellent | Excellent | P* |
| Example 27 | 86 | 0.5 | — | — Good | Excellent | Good | Excellent | Excellent | P* |
| Example 28 | 86 | 0.5 | — | — Good | Excellent | Excellent | Excellent | Excellent | P* |
| Comparative Example 4 | 88 | 0.1 | — | — Poor | Poor | Poor | Excellent | — | C* (Etching) |
| Comparative Example 5 | 86 | 90 | — | — Good | Poor | Poor | Good | — | C* (Silver Salt) |
| Comparative Example 6 | 81 | 5 | — | — Good | Poor | Poor | Good | — | C* (Silver Paste) |
| Comparative Example 7 | 87 | 9 | — | — Good | Poor | Poor | Good | — | |
| Comparative Example 8 | — | — | — | — Good | Poor | Poor | Good | — | |

Note:
(i) Surface Resistance after Hot Water/Water Vapor Treatment
C* Comparative Example
P* Present Invention

TABLE 7

|  | Opening ratio (%) | Surface resistivity Ω/sq | Hot water/water vapor treatment time | Surface resistance after hot water/water vapor treatment | Number of steps | Black color on conductive film side | Black color on backside | Film strength | Plating rate | Note |
|---|---|---|---|---|---|---|---|---|---|---|
| Example 29 | 87 | 1.5 | Hot Water 90° C., 1' | 0.7 | Good | Good | Poor | Excellent | Excellent | Present Invention |
| Example 30 | 89 | 1.8 | Hot Water 90° C., 5' | 0.8 | Good | Good | Good | Excellent | Excellent | Present Invention |
| Example 31 | 89 | 1.7 | Hot Water 90° C., 10' | 0.7 | Good | Good | Good | Excellent | Excellent | Present Invention |
| Example 32 | 89 | 1.7 | Water Vapor 100° C., 0.5' | 0.7 | Good | Good | Good | Excellent | Excellent | Present Invention |
| Example 33 | 89 | 1.6 | Water Vapor 100° C., 0.5' | 0.7 | Good | Good | Good | Excellent | Excellent | Present Invention |
| Example 34 | 89 | 1.5 | Water Vapor 100° C., 0.5' | 0.6 | Good | Good | Good | Excellent | Excellent | Present Invention |
| Example 35 | 89 | 1.7 | Water Vapor 100° C., 0.5' | 0.7 | Good | Good | Good | Excellent | Excellent | Present Invention |
| Example 36 | 89 | 1.6 | Water Vapor 100° C., 0.5' | 0.8 | Good | Excellent | Excellent | Excellent | Excellent | Present Invention |
| Example 37 | 89 | 1.4 | Hot Water 90° C., 1' | 0.7 | Good | Good | Good | Excellent | Excellent | Present Invention |
| Example 38 | 89 | 1.4 | 5' | 0.6 | Good | Good | Good | Excellent | Excellent | Present Invention |
| Example 39 | 89 | 1.3 | Water Vapor 100° C., 0.5' | 0.7 | Good | Good | Good | Excellent | Excellent | Present Invention |
| Example 40 | 89 | 1.4 | Water Vapor 100° C., 1' | 0.7 | Good | Good | Good | Excellent | Excellent | Present Invention |
| Example 41 | 89 | 1.4 | Water Vapor 100° C., 0.5' | 0.7 | Good | Good | Good | Excellent | Excellent | Present Invention |
| Example 42 | 89 | 1.4 | Water Vapor 100° C., 0.5' | 0.6 | Good | Good | Good | Excellent | Excellent | Present Invention |
| Example 43 | 89 | 1.3 | Water Vapor 100° C., 0.5' | 0.7 | Good | Excellent | Excellent | Excellent | Excellent | Present Invention |

As shown in Tables 6 and 7, the etched copper mesh of Comparative Example 4 had brown color and was produced by many steps. The silver salt-using mesh of Comparative Example 5 had a high surface resistivity and was insufficient in electromagnetic wave-shielding ability. The silver paste-printed mesh of Comparative Example 6 had a large line width and thereby had a low opening ratio. In this case, the opening ratio could be increased by widening the pitch as Comparative Example 7. However, another problem of high surface resistivity was caused in Comparative Example 7.

In contrast, the above problems of Comparative Examples were not caused in Examples 21 to 43. Each sample of Examples 21 to 43 exhibited a small line width, almost no increase from the original line width, a high opening ratio, a low surface resistivity, and a high electromagnetic wave-shielding ability.

In Example 27 according to a more preferred embodiment, the mesh had the metal portion with black color, and thereby prevents contrast reduction on display image. In addition, the mesh could be produced by fewer steps.

Furthermore, each sample of Examples 21 to 43 had a high film strength, whereby the mesh portion is hardly cracked or peeled in handling and has a highly reliable quality.

Two calender roll units for calender treatments were used. The first calender roll unit contained a combination of a metal roll having an embossed surface and a metal roll having a mirror finished surface, and the second calender roll unit contained a combination of a metal roll having a mirror finished surface and a resin roll.

Figure 2:
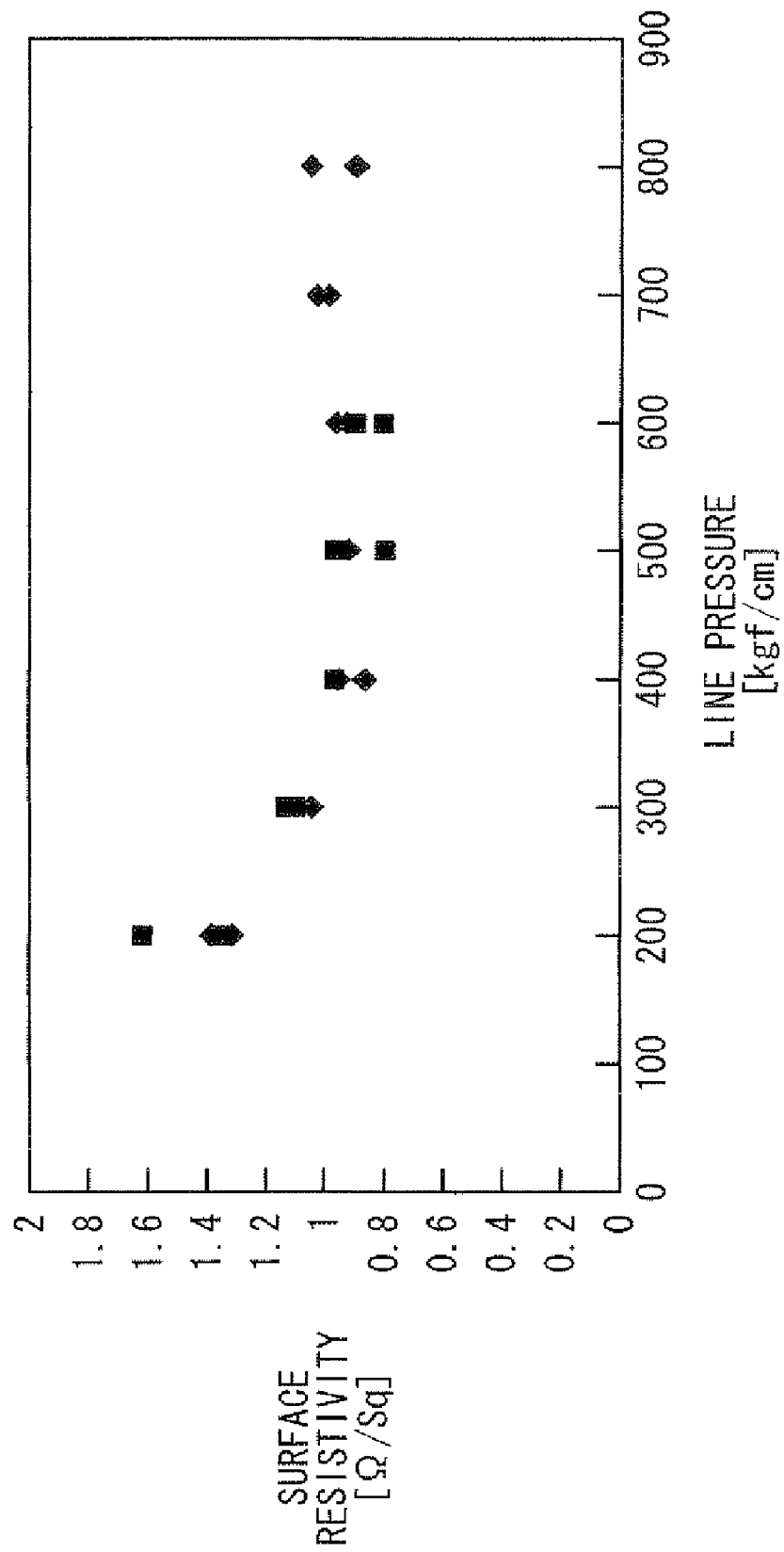
FIG. 2 is a characteristic diagram showing the relation between line pressure and surface resistivity in a calender treatment.

The surface resistivity change with the line pressure in the calender treatment (after development and after fixation) using the first calender roll unit is shown by diamond plot in FIG. 2. The surface resistivity change with the line pressure in the calender treatment (after development and after fixation) using the second calender roll unit is shown by quadrangular plot in FIG. 2.

It is clear from FIG. 2 that, in the case of carrying out the calender treatment not only after the development but also after the fixation, a surface resistivity of 1.8 ($\Omega$/sq) or less could be achieved by controlling the line pressure at 200 (kgf/cm) or more, regardless of the type of the calender roll unit. When the line pressure was increased to more than 700 (kgf/cm), the surface resistivity was slightly increased. Thus, the upper limit of the line pressure is preferably 700 (kgf/cm) or less.

It is to be understood that the conductive film and the production method of the present invention are not limited to the above embodiments, and various changes and modifications may be made therein without departing from the scope of the invention.

The invention claimed is:

1. A method for producing a conductive film, comprising:
a metallic silver forming step of exposing and developing a photosensitive material comprising a support and thereon a silver salt-containing layer containing a silver salt to form a metallic silver portion; and
a smoothing treatment step of subjecting the metallic silver portion to a smoothing treatment,
wherein after the development, the metallic silver portion comprises silver and a non-conductive polymer, and
the non-conductive polymer comprises a natural macromolecular polysaccharide derived from a macromolecular red alga.

2. A method according to claim 1, wherein the smoothing treatment is carried out using a calender roll.

3. A method according to claim 2, wherein the smoothing treatment is carried out at a line pressure of 1960 N/cm (200 kgf/cm) or more.

4. A method according to claim 2, wherein the smoothing treatment is carried out at a line pressure of 2940 N/cm (300 kgf/cm) or more.

5. A method according to claim 2, wherein the smoothing treatment is carried out at a line pressure of 6860 N/cm (700 kgf/cm) or less.

6. A method according to claim 1, wherein the development comprises a fixation treatment, and a layer containing the metallic silver portion is dried before the fixation treatment.

7. A method according to claim 1, wherein the development comprises a fixation treatment, and the development, drying of the metallic silver portion, the smoothing treatment, and the fixation treatment are carried out in this order.

8. A method according to claim 1, wherein the development comprises a fixation treatment, and the photosensitive material is treated with a fixer that is free from thiosulfate salts or contains 0.1 mol/L or less of a thiosulfate salt.

9. A method according to claim 1, wherein the silver salt-containing layer or a developer contains a polyethylene oxide derivative.

10. A method according to claim 1, wherein the development is carried out at 25° C. or lower.

11. A method according to claim 1, wherein a photographically useful compound capable of adsorbing to a particle to stabilize the particle morphology is added before water washing and demineralization in preparation of the silver salt.

12. A method according to claim 1, wherein the metallic silver portion has an Ag/non-conductive polymer volume ratio of 2/1 or more.

13. A method according to claim 1, wherein the non-conductive polymer comprises a gelatin at a volume ratio of 50% or more.

14. A method according to claim 1, wherein the natural macromolecular polysaccharide derived from the red alga is selected from kappa carrageenans, iota carrageenans, lambda carrageenans, and furcellarans.

15. A method according to claim 1, wherein the silver salt-containing layer has an Ag/binder volume ratio of 1/1 or more.

16. A method according to claim 1, wherein the silver salt-containing layer comprises at least two emulsion layers, the emulsion layer closest to the support has an Ag/binder volume ratio of 1.5/1 or less, and the upper emulsion layer has an Ag/binder volume ratio of 1.5/1 or more.

17. A method according to claim 1, wherein the metallic silver portion has a thickness of 0.5 to 5 µm.

18. A method according to claim 1, wherein the metallic silver portion has a wiring pattern with a line width of 0.1 to 25 µm.

19. A conductive film comprising a support and a metallic silver portion formed on the support, wherein the metallic silver portion comprises silver and a non-conductive polymer, and the non-conductive polymer comprises a natural macromolecular polysaccharide derived from a macromolecular red alga.

20. The conductive film according to claim 19, wherein the metallic silver portion has an Ag/non-conductive polymer volume ratio of 2/1 or more.

21. The conductive film according to claim 19, wherein the non-conductive polymer comprises a gelatin at a volume ratio of 50% or more.

22. The conductive film according to claim 19, wherein the natural macromolecular polysaccharide derived from the red alga is selected from kappa carrageenans, iota carrageenans, lambda carrageenans, and furcellarans.

23. The conductive film according to claim 19, wherein the metallic silver portion has a wiring pattern with a line width of 0.1 to 25 µm.

* * * * *